United States Patent
Dai et al.

(10) Patent No.: US 12,432,971 B2
(45) Date of Patent: *Sep. 30, 2025

(54) TRANSISTOR INCLUDING A HYDROGEN-DIFFUSION BARRIER AND METHODS FOR FORMING THE SAME

(71) Applicant: Taiwan Semiconductor Manufacturing Company Limited, Hsinchu (TW)

(72) Inventors: Min-Kun Dai, Hsinchu (TW); Wei-Gang Chiu, New Taipei (TW); I-Cheng Chang, Hsinchu (TW); Cheng-Yi Wu, Taichung (TW); Han-Ting Tsai, Kaoshiung (TW); Tsann Lin, Hsinchu (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/423,471

(22) Filed: Jan. 26, 2024

(65) Prior Publication Data

US 2024/0162318 A1 May 16, 2024

Related U.S. Application Data

(63) Continuation of application No. 17/523,967, filed on Nov. 11, 2021, now Pat. No. 11,935,935.

(Continued)

(51) Int. Cl.
*H01L 29/423* (2006.01)
*H10D 30/01* (2025.01)
(Continued)

(52) U.S. Cl.
CPC ......... *H10D 30/673* (2025.01); *H10D 30/031* (2025.01); *H10D 30/67* (2025.01); *H10D 30/6729* (2025.01); *H10D 64/514* (2025.01)

(58) Field of Classification Search
CPC .... H10D 30/673; H10D 30/031; H10D 30/67; H10D 30/6729; H10D 64/514;
(Continued)

(56) References Cited

U.S. PATENT DOCUMENTS

2015/0206976 A1* 7/2015 Song .................. H10D 99/00
257/43
2021/0327914 A1 10/2021 Mo et al.

FOREIGN PATENT DOCUMENTS

TW 201505186 A 2/2015
WO 2018/125140 A1 7/2018

OTHER PUBLICATIONS

Taiwanese Patent and Trademark Office, Application No. 111108990, Office Action, mailed Jan. 13, 2023, 5 pages.

* cited by examiner

*Primary Examiner* — Mohammed R Alam
(74) *Attorney, Agent, or Firm* — The Marbury Law Group, PLLC

(57) ABSTRACT

A thin film transistor includes a gate electrode embedded in an insulating layer that overlies a substrate, a gate dielectric overlying the gate electrode, an active layer comprising a compound semiconductor material and overlying the gate dielectric, and a source electrode and drain electrode contacting end portions of the active layer. The gate dielectric may have thicker portions over interfaces with the insulating layer to suppress hydrogen diffusion therethrough. Additionally or alternatively, a passivation capping dielectric including a dielectric metal oxide material may be interposed (Continued)

between the active layer and a dielectric layer overlying the active layer to suppress hydrogen diffusion therethrough.

20 Claims, 24 Drawing Sheets

Related U.S. Application Data

(60) Provisional application No. 63/183,334, filed on May 3, 2021.

(51) Int. Cl.
*H10D 30/67* (2025.01)
*H10D 64/27* (2025.01)

(58) Field of Classification Search
CPC ........... H10D 30/6757; H10D 30/6755; H10D 99/00; H10D 84/0181; H10D 84/038; H10D 30/6736
See application file for complete search history.

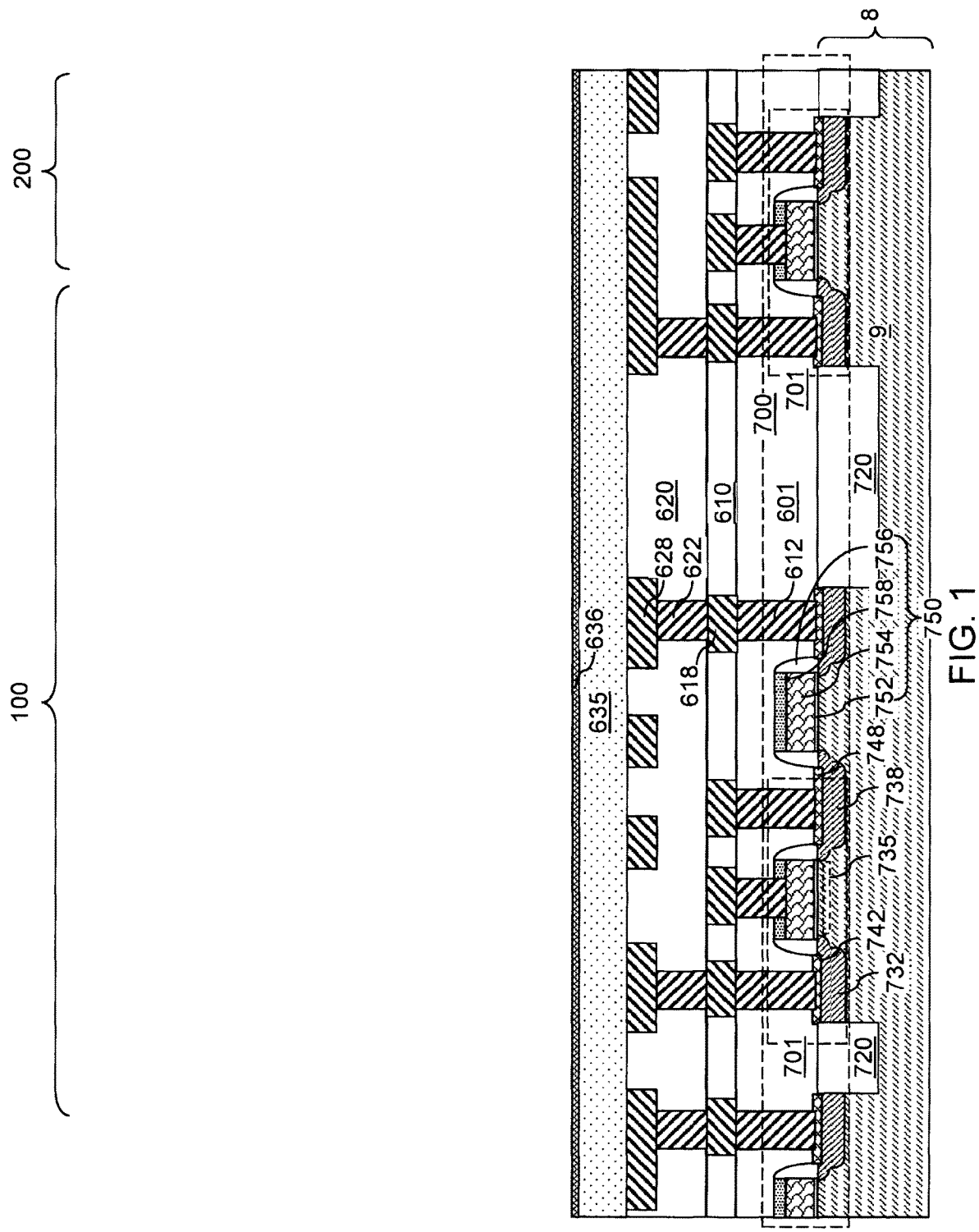

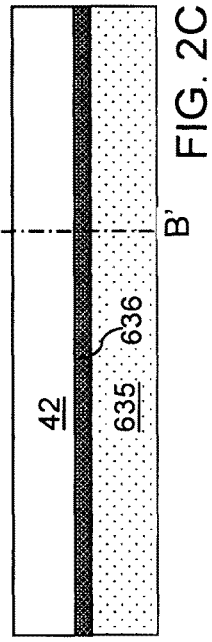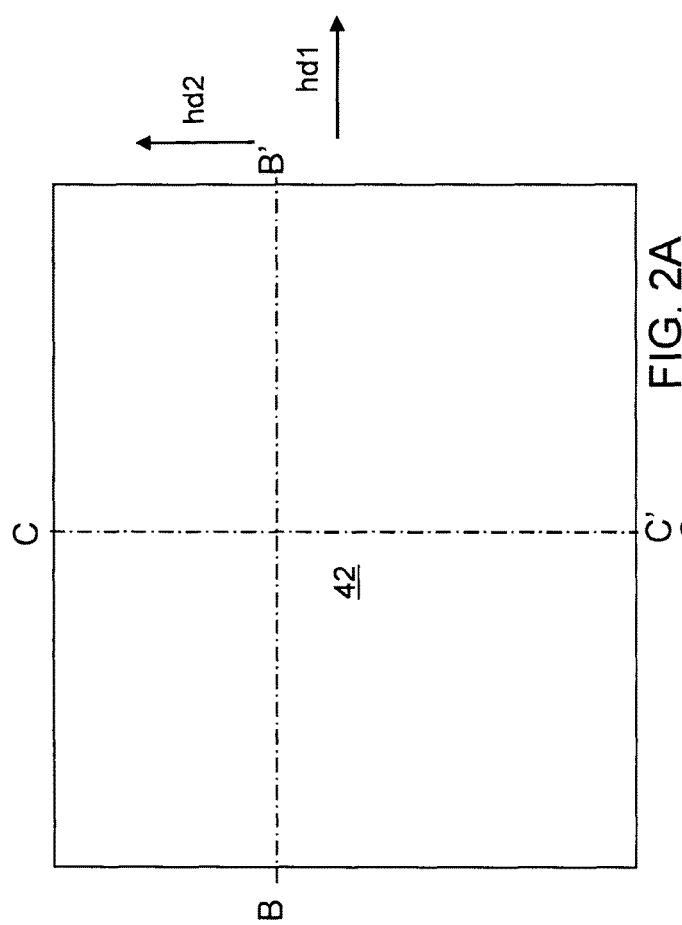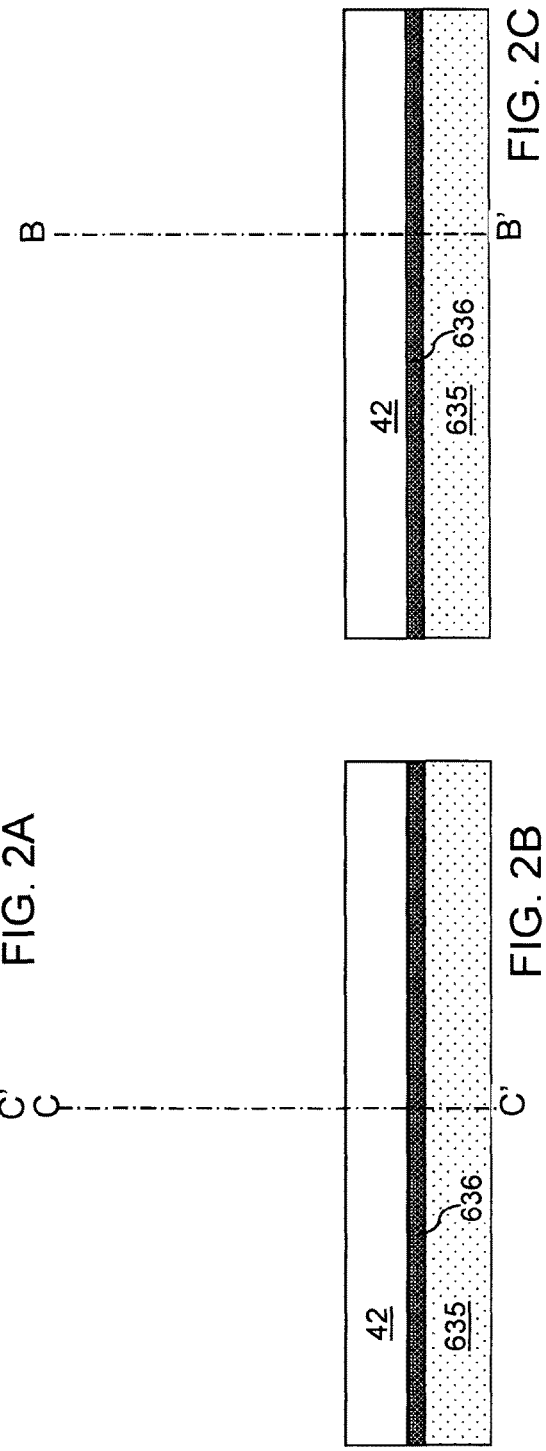

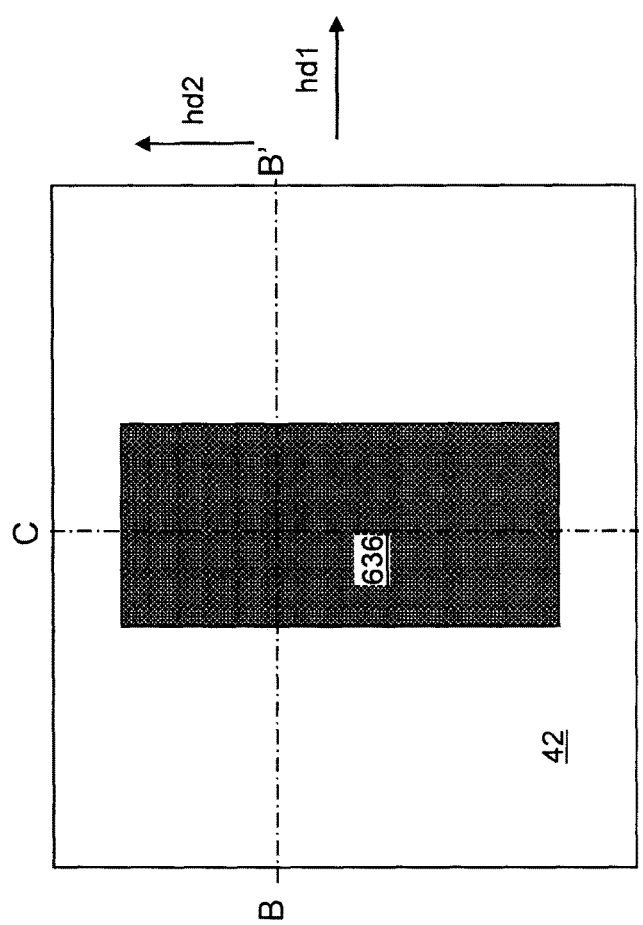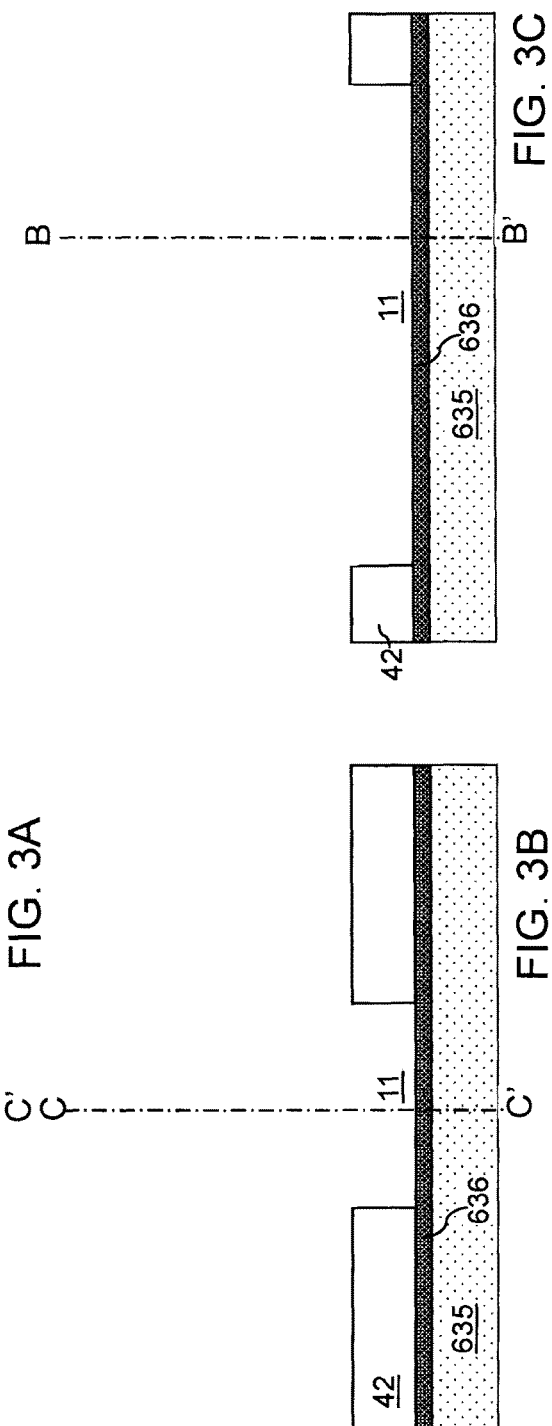

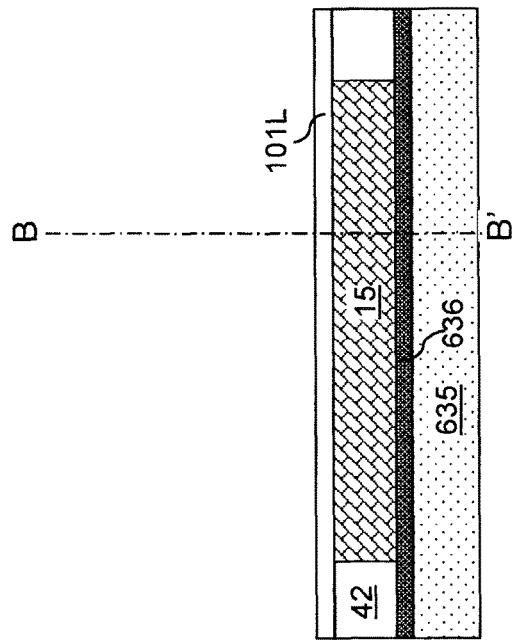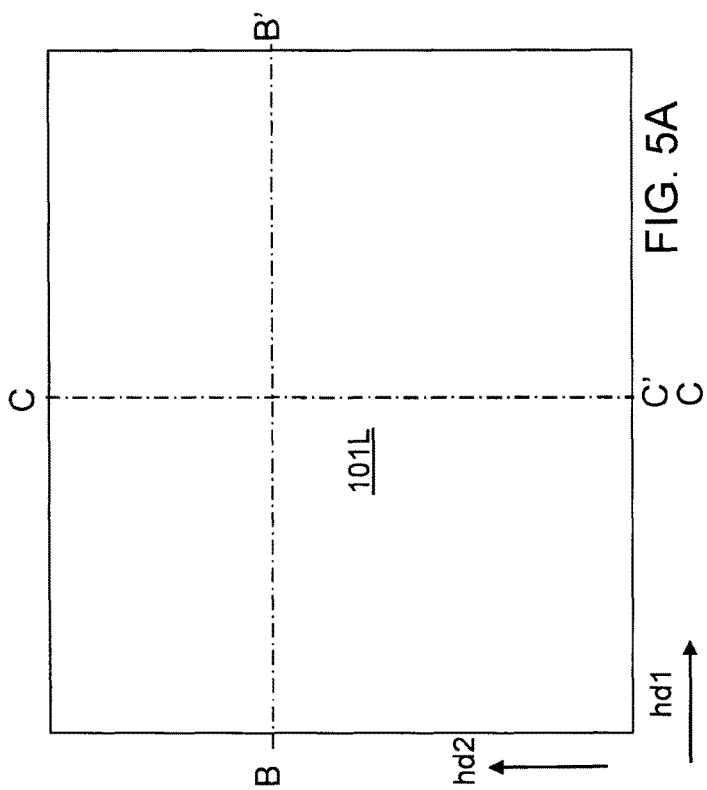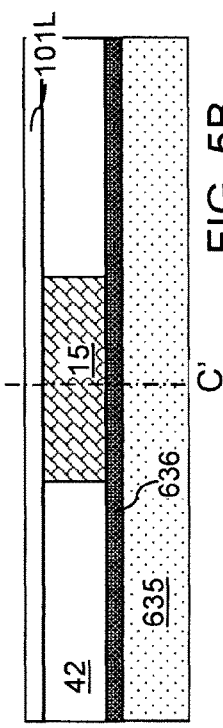

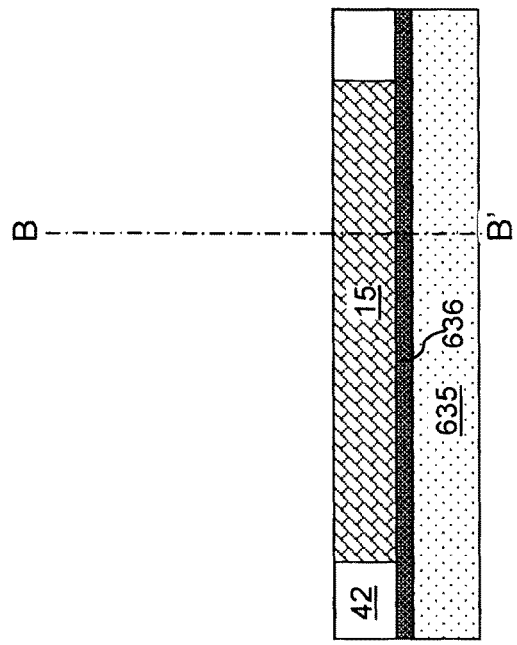
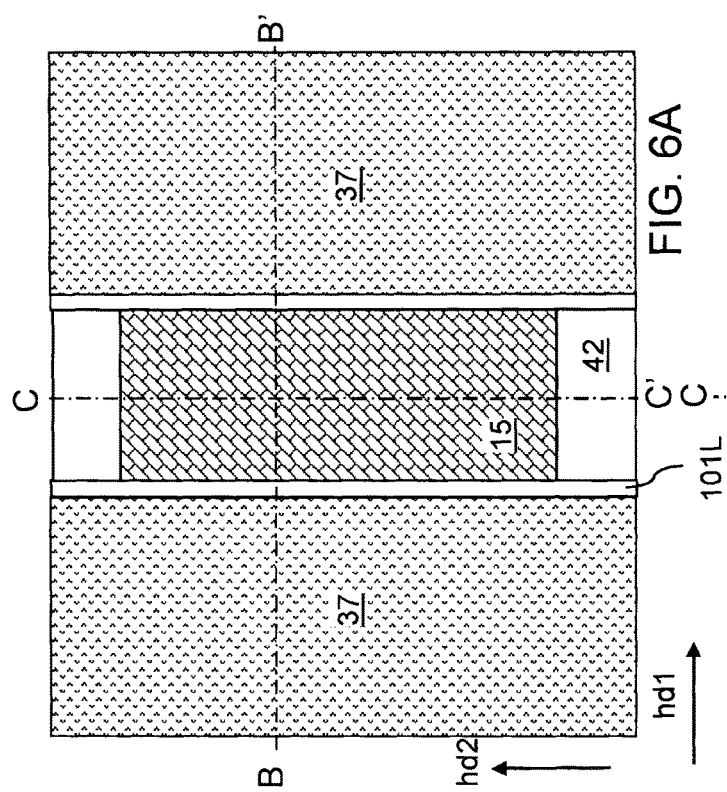
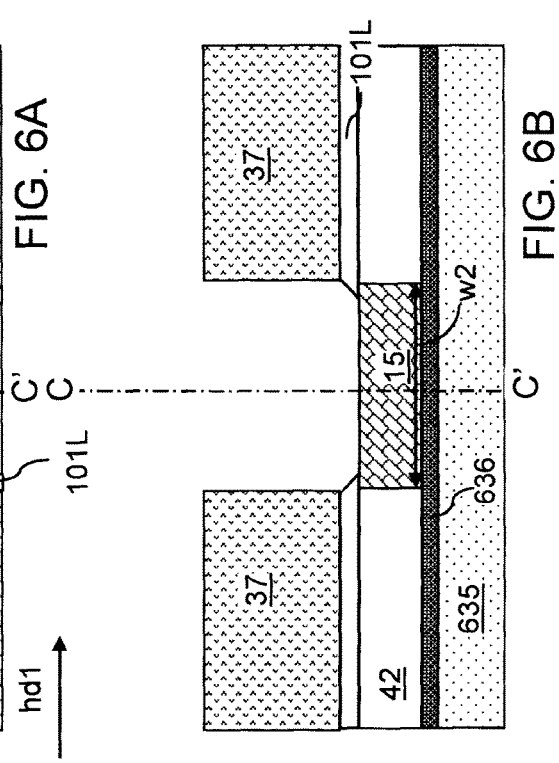
FIG. 6C
FIG. 6A
FIG. 6B

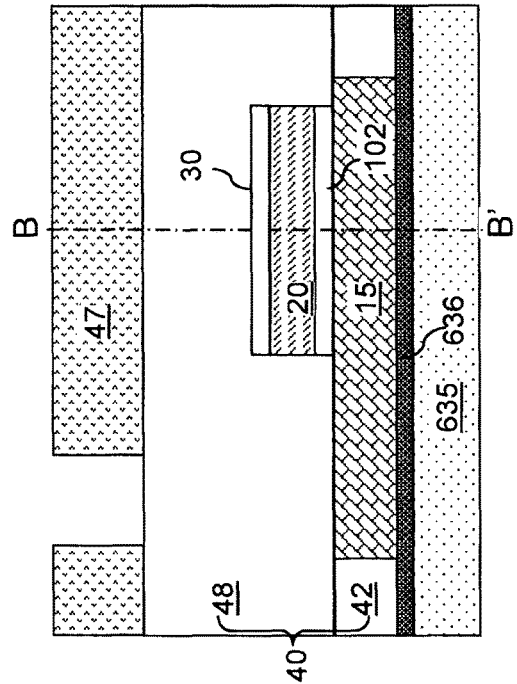
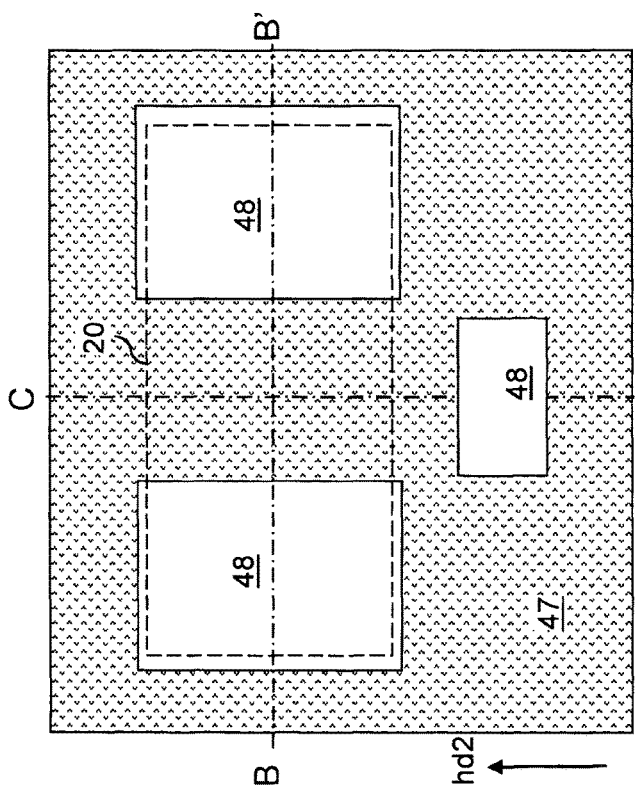
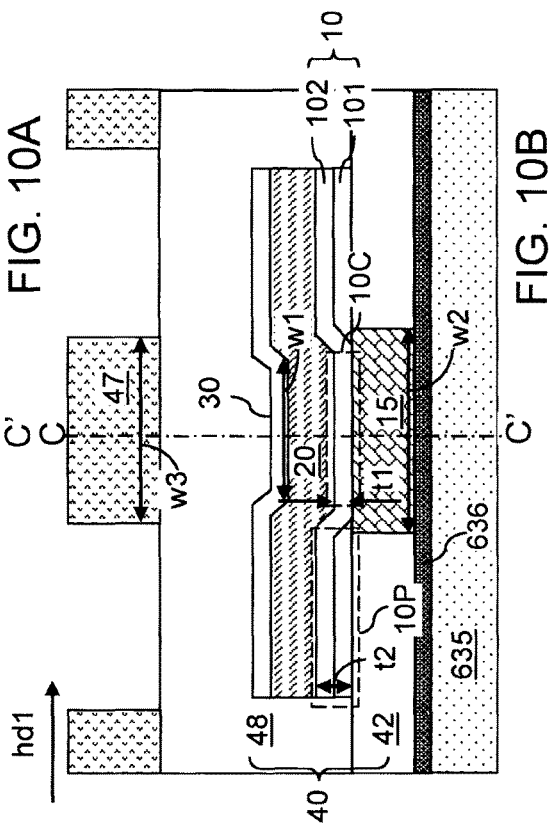
FIG. 10A
FIG. 10B
FIG. 10C

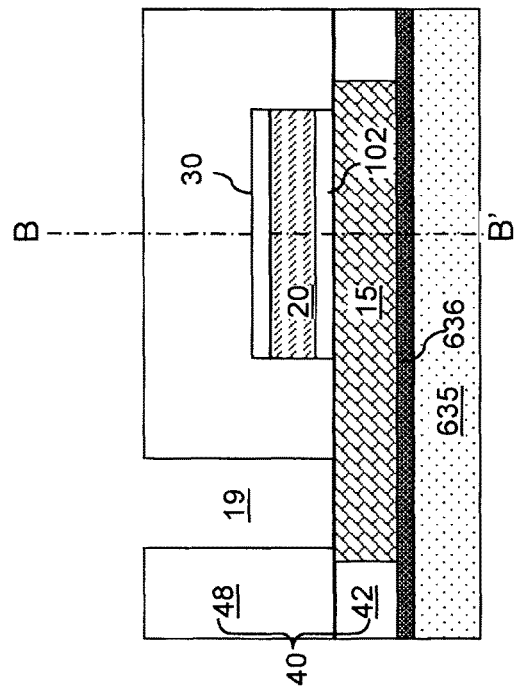
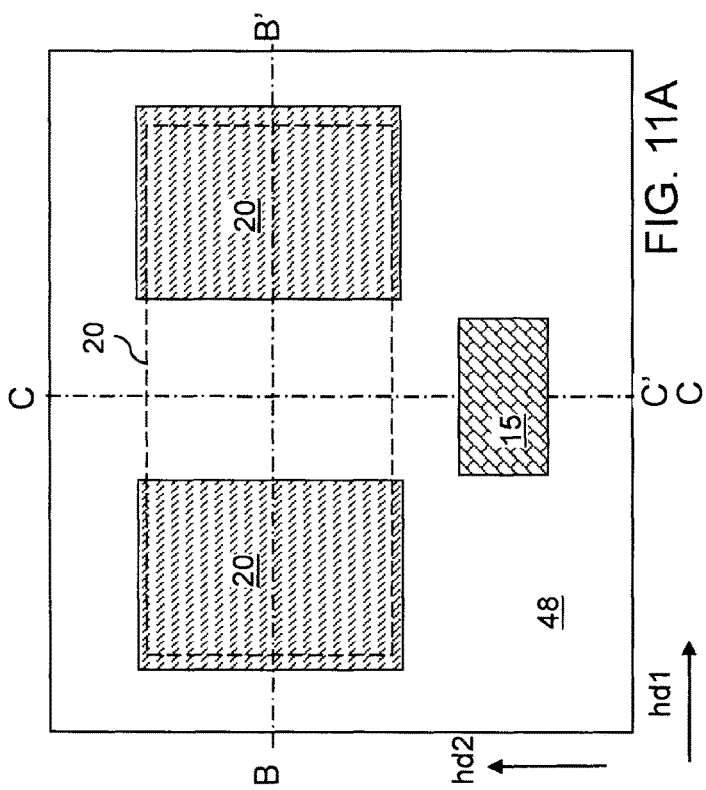
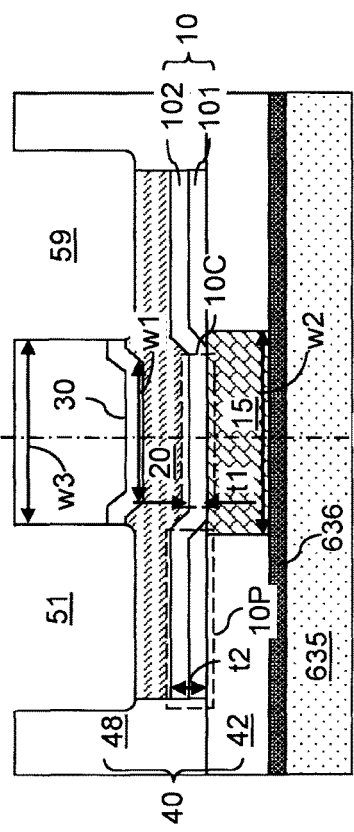
FIG. 11A
FIG. 11B
FIG. 11C

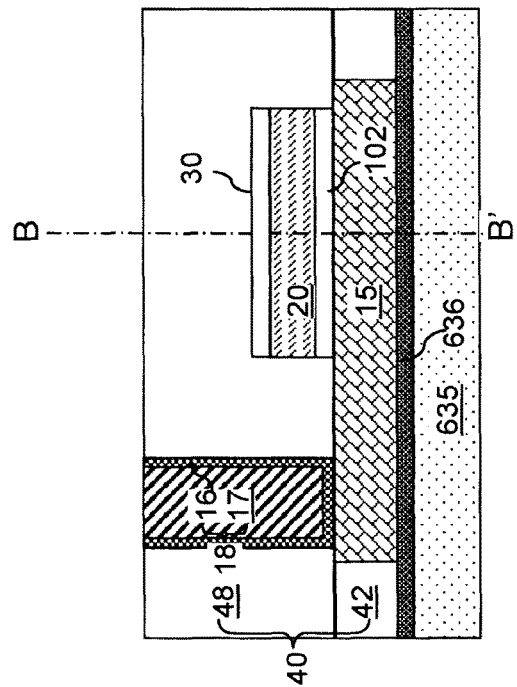
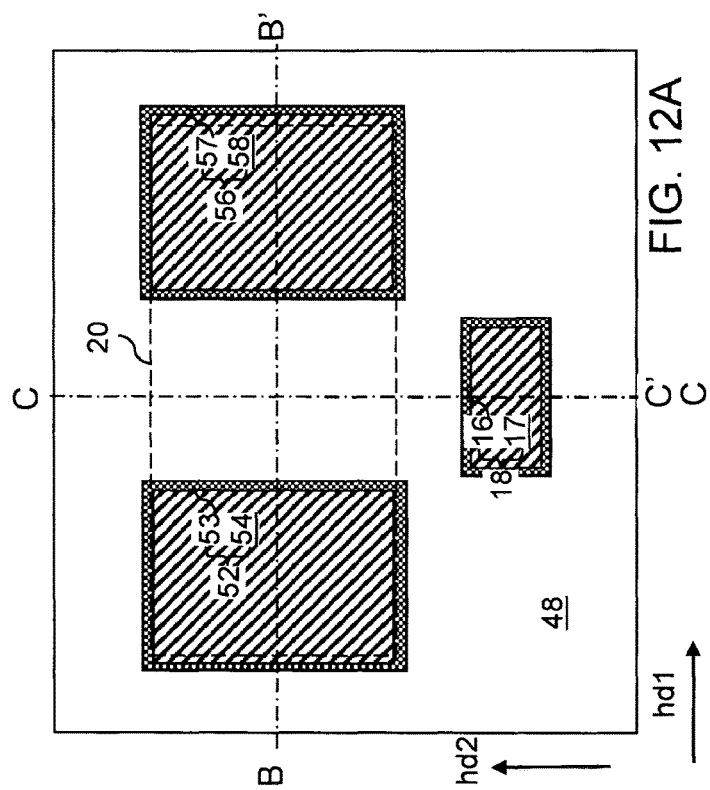
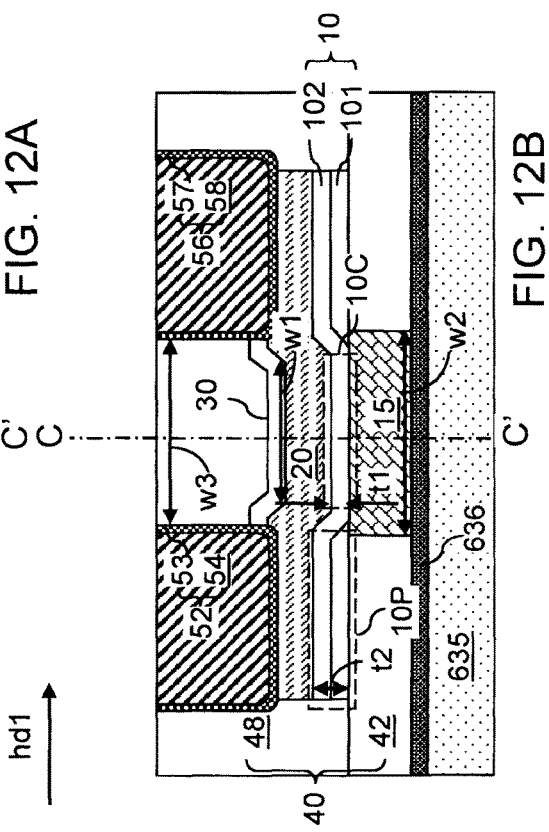
FIG. 12C
FIG. 12A
FIG. 12B

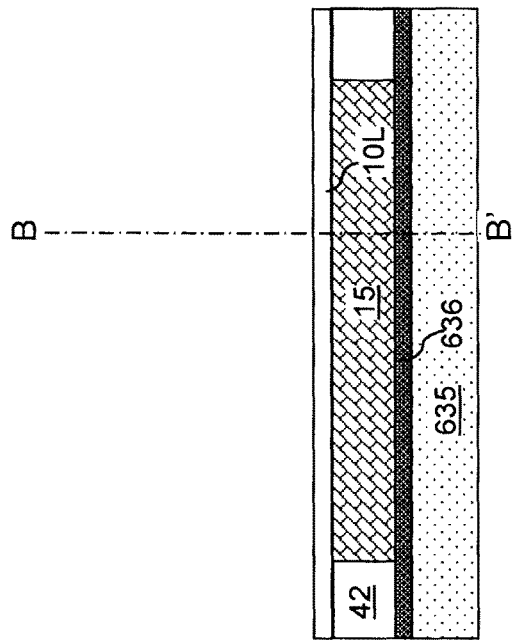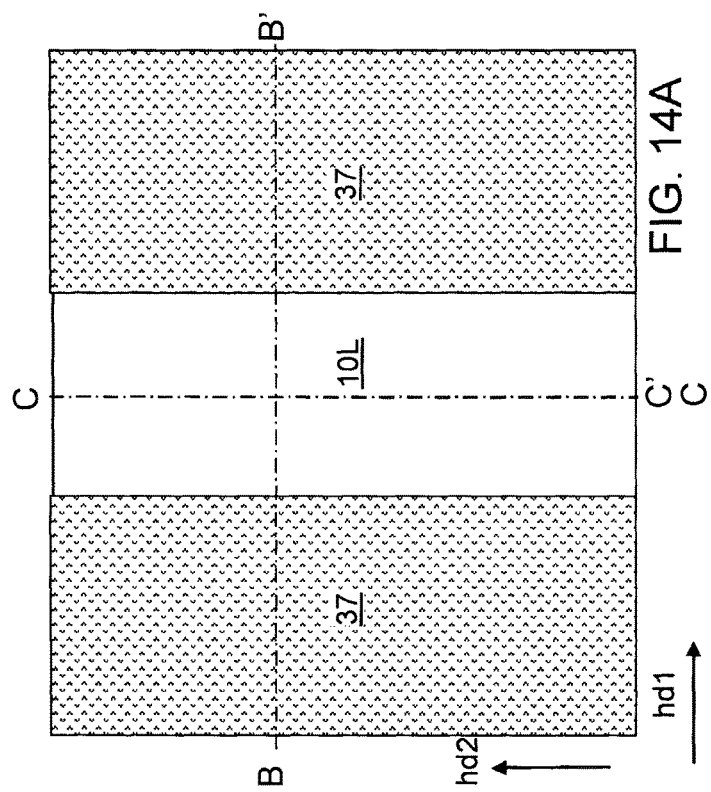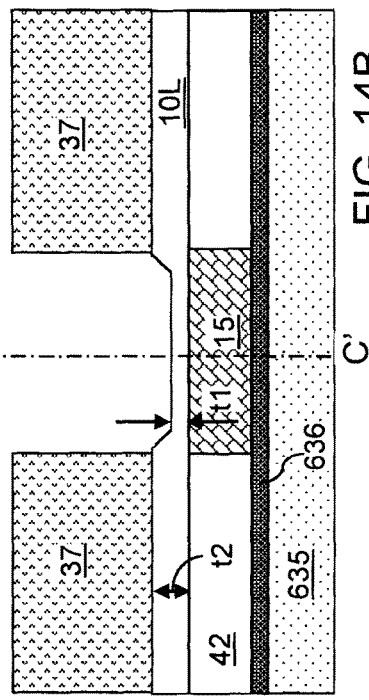
FIG. 14C
FIG. 14A
FIG. 14B

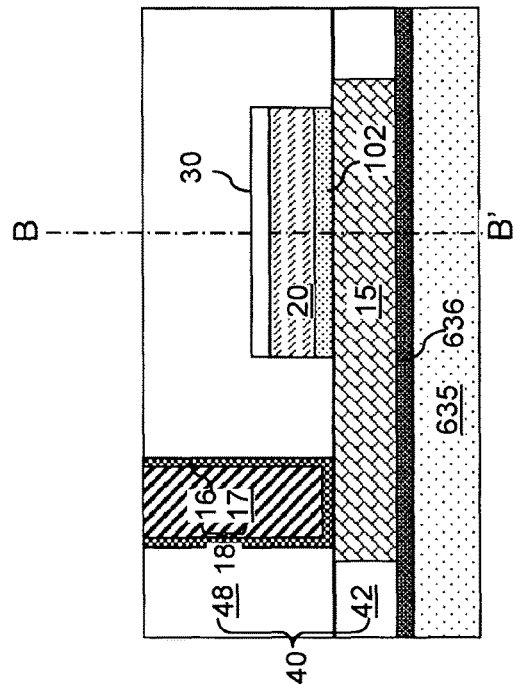
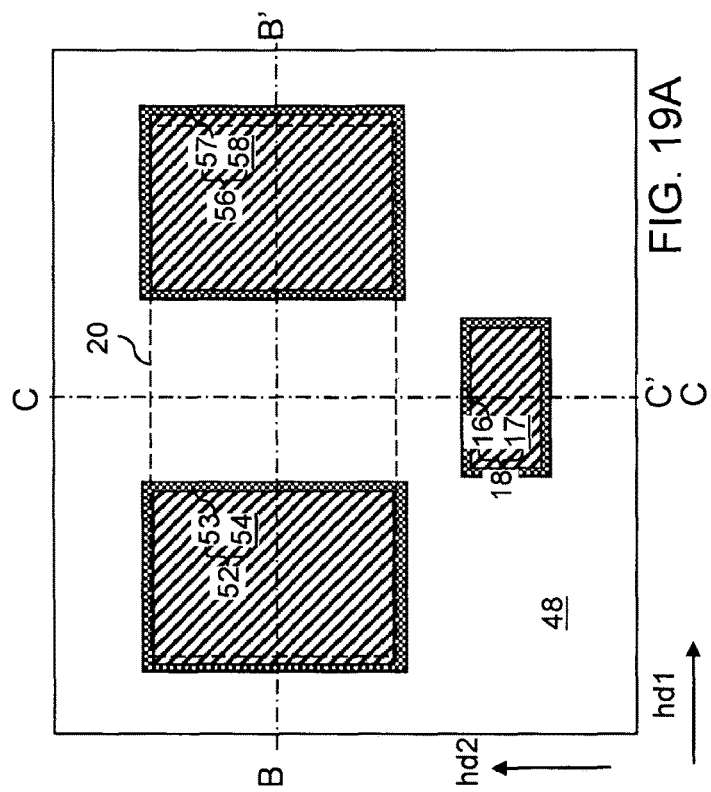
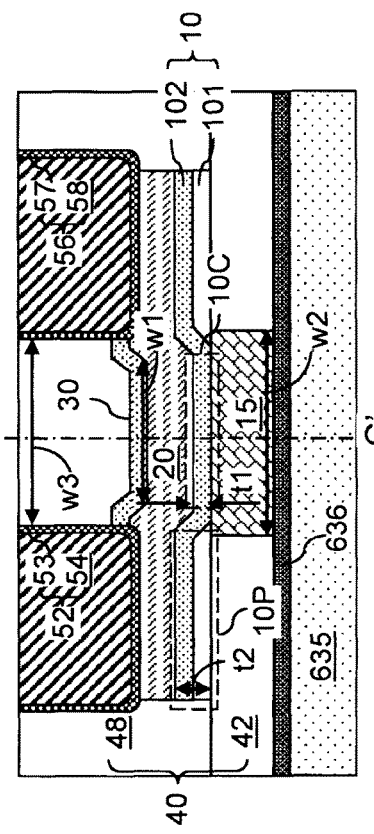
FIG. 19C
FIG. 19A
FIG. 19B

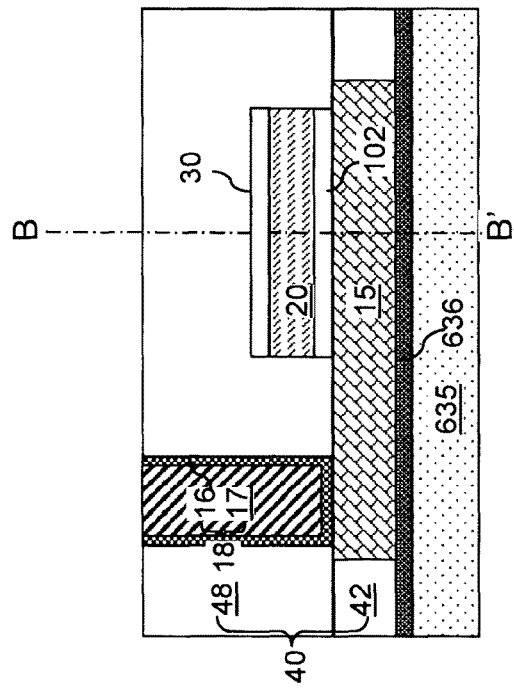
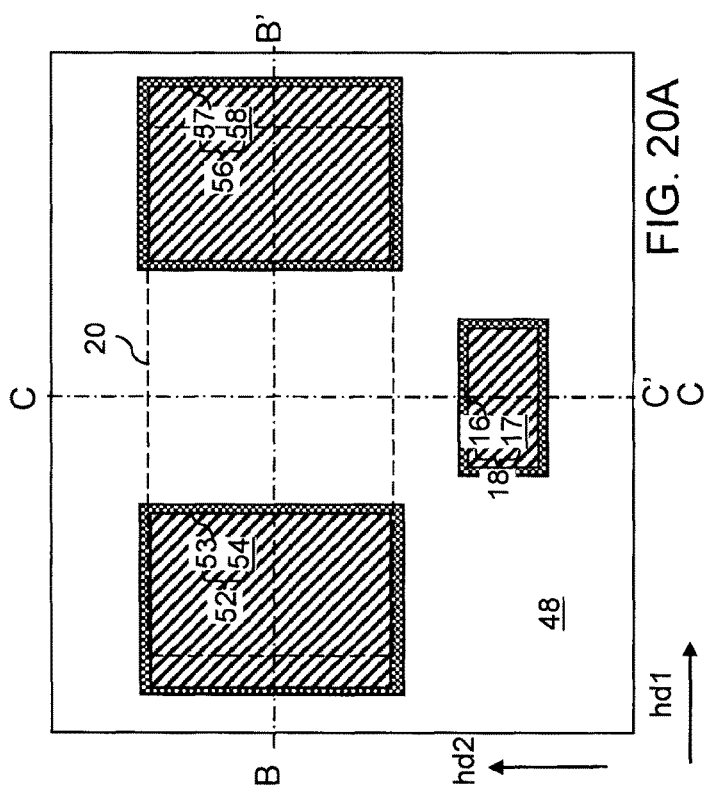
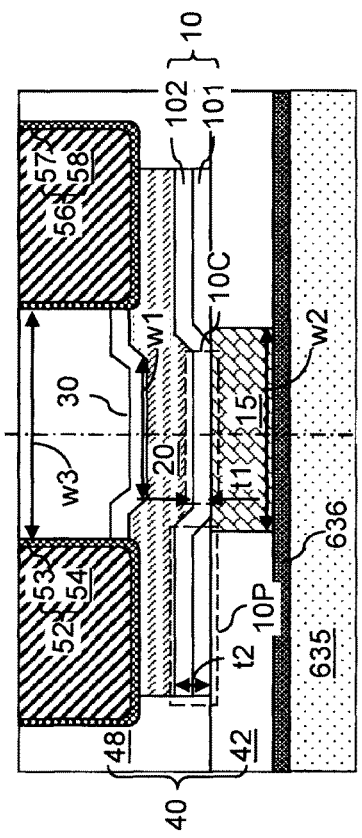
FIG. 20C
FIG. 20A
FIG. 20B

TRANSISTOR INCLUDING A HYDROGEN-DIFFUSION BARRIER AND METHODS FOR FORMING THE SAME

RELATED APPLICATIONS

This application is a continuation application of U.S. application Ser. No. 17/523,967 filed on Nov. 11, 2021, which claims the benefit of priority from a U.S. provisional application Ser. No. 63/183,334, titled "Semiconductor structure and method for manufacturing the same," filed on May 3, 2021, the entire contents of which are incorporated herein by reference for all purposes.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a vertical cross-sectional view of a first exemplary structure after formation of complementary metal-oxide-semiconductor (CMOS) transistors, first metal interconnect structures formed in lower-level dielectric layers, an insulating spacer layer, and an optional etch stop dielectric layer according to an embodiment of the present disclosure.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 5A is a top-down view of a region of the first exemplary structure after formation of a first gate dielectric layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 6A is a top-down view of a region of the first exemplary structure after patterning the first gate dielectric layer according to the first embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 10A is a top-down view of a region of the first exemplary structure after formation of a patterned photoresist layer according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a source cavity, a drain cavity, and a gate contact via cavity according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of the first exemplary structure after formation of a source electrode, a drain electrode, and a backside electrode contact via structure according to the first embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 14A is a top-down view of a region of the second exemplary structure after thinning a center portion of the gate dielectric layer according to the second embodiment of the present disclosure.

FIG. 14B is a vertical cross-sectional view of the second exemplary structure along the vertical plane B-B' of FIG. 14A.

FIG. 14C is a vertical cross-sectional view of the second exemplary structure along the vertical plane C-C' of FIG. 14A.

FIG. 19A is a top-down view of a region of a second alternative embodiment of the fourth exemplary structure according to the fourth embodiment of the present disclosure.

FIG. 19B is a vertical cross-sectional view of the fourth exemplary structure along the vertical plane B-B' of FIG. 19A.

FIG. 19C is a vertical cross-sectional view of the fourth exemplary structure along the vertical plane C-C' of FIG. 19A.

FIG. 20A is a top-down view of a region of a fifth exemplary structure according to a fifth embodiment of the present disclosure.

FIG. 20B is a vertical cross-sectional view of the fifth exemplary structure along the vertical plane B-B' of FIG. 20A.

FIG. 20C is a vertical cross-sectional view of the fifth exemplary structure along the vertical plane C-C' of FIG. 20A.

DETAILED DESCRIPTION

Figure 4A:
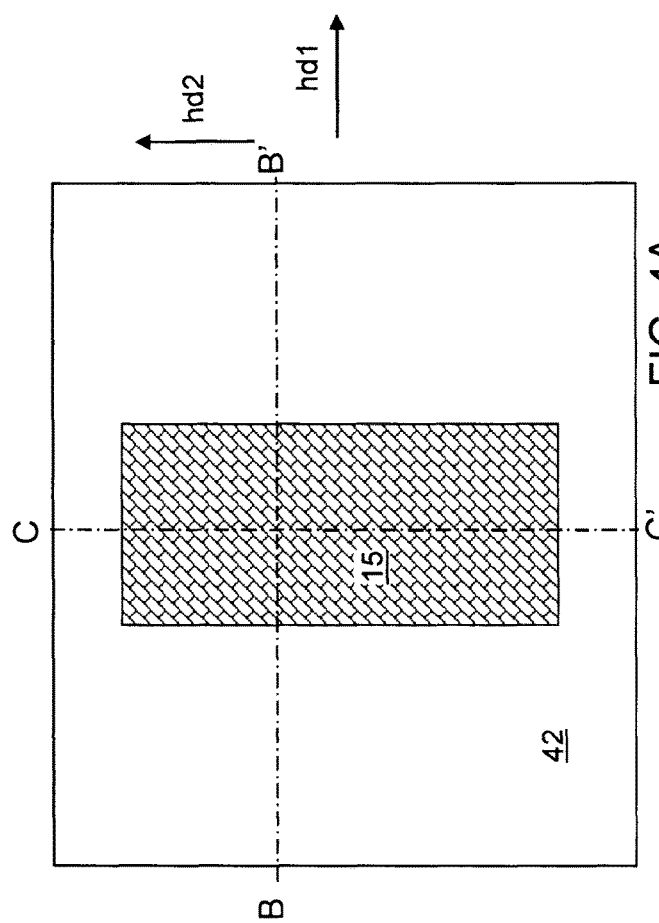
FIG. 4A is a top-down view of a region of the first exemplary structure after formation of a gate electrode according to the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Transistors, and in particular, thin film transistor may suffer from electrical instability. Thus, the performance of the transistor may suffer. Generally, the instability of a thin film transistor using a semiconducting metal oxide channel may be caused by the variability in the manufacturing process and the environment in which the transistor is used. For example, hydrogen atoms and oxygen vacancies may destabilize the electrical properties of a semiconducting metal oxide material of a transistor. In addition, the variability of the atomic concentration of the hydrogen atoms and the oxygen vacancies may cause instability in the electrical characteristics in the transistor. For example, hydrogen atoms may diffuse from undoped silicate glass into indium gallium zinc oxide (IGZO) through aluminum oxide, and ambient oxygen atoms and water vapors may be absorbed into the back channel composed of the semiconducting metal oxide material, and may induce deleterious effects on the reliability of transistors.

The structures and methods of the present disclosure may be used to enhance the electrical stability of a semiconducting metal oxide material in an active layer of a transistor (e.g., a thin-film transistor). Thus, the embodiment structures and methods may enhance the performance of the transistor. In one embodiment, a gate dielectric may be patterned to provide enhanced thickness regions in areas that are distal from a gate electrode. Additionally or alternatively, a passivation capping dielectric using a dielectric metal oxide material such as hafnium oxide may be used to reduce ingress of hydrogen atoms into an active layer. The various structures and methods of the present disclosure may be used to increase the electrical stability of a semiconducting metal oxide material (such as indium gallium zinc oxide), and to increase device performance and reliability of a transistor. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material. The exemplary structure may include a memory region 100 and a logic region 200.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may include bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-lower-level dielectric layers. The metal interconnect structures (612, 618, 622, 628) formed within in the lower-level dielectric layers are herein referred to as lower-level metal interconnect structures.

While the present disclosure is described using an embodiment wherein transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of transistors (such as thin-film transistors) or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating spacer layer 635. The insulating spacer layer 635 includes a dielectric material such as undoped silicate glass, a doped silicate glass, organosilicate glass, or a porous dielectric material, and may be deposited by chemical vapor deposition. The thickness of the insulating spacer layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating spacer layer 635 may be formed over the interconnect-level dielectric layers.

In one embodiment, the substrate 8 may include a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be formed within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a transistor (e.g., a thin-film transistor) may be subsequently formed. While the present disclosure is described using a single instance of a transistor, it is understood that multiple instances of the transistor may be simultaneously formed in any of the exemplary structures of the present disclosure.

An insulating layer 42 may be formed over the insulating spacer layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple transistors, such as multiple thin film transistors, may be subsequently formed over the insulating layer 42. In one embodiment, the multiple transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating spacer layer 635 (in embodiments in which the etch stop dielectric layer 636 is not used) is exposed. The photoresist layer may be subsequently removed, for example, by ashing.

Figure 4B:
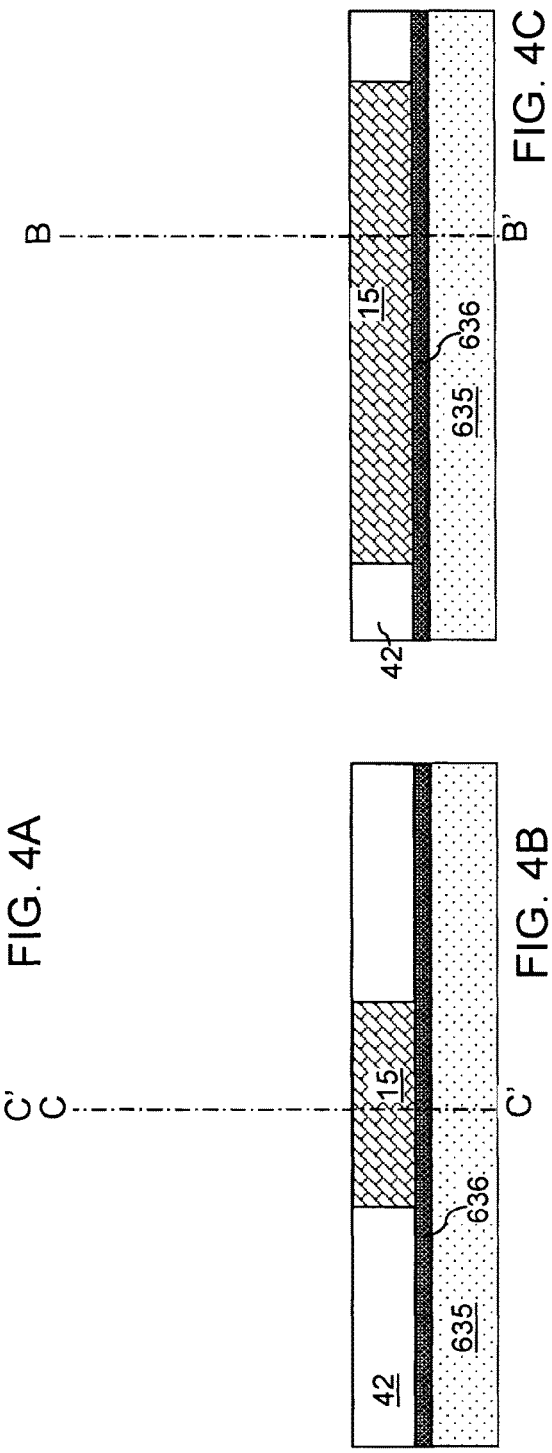
FIG. 4B is a vertical cross-sectional view of the first exemplary structure along the vertical plane B-B' of FIG. 4A.
Figure 4C:
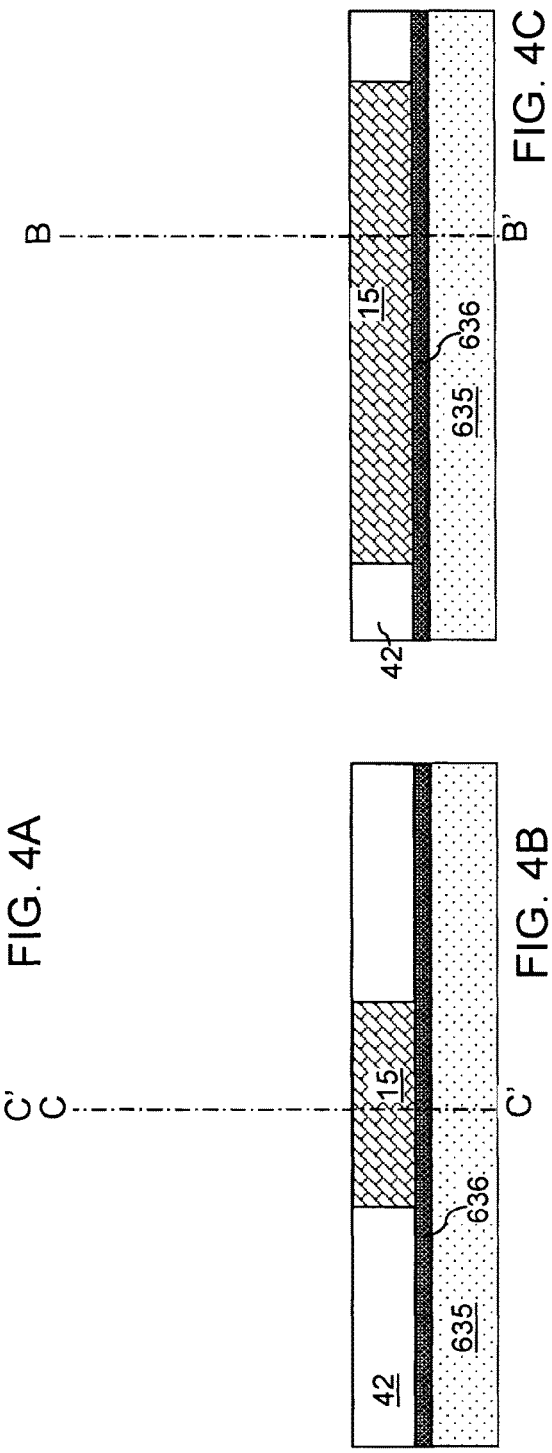
FIG. 4C is a vertical cross-sectional view of the first exemplary structure along the vertical plane C-C' of FIG. 4A.

Referring to FIGS. 4A-4C, at least one conductive material may be deposited in the recess region 11. The at least one conductive material may include, for example, a metallic barrier liner material (such as TiN, TaN, and/or WN) and a metallic fill material (such as Cu, W, Mo, Co, Ru, etc.). Other suitable metallic barrier liner material and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A gate electrode 15 may be formed in the recess region 11. The gate electrode 15 may be formed within the insulating layer 42. The top surface of the gate electrode 15 may be located within a same horizontal plane as the top surface of the insulating layer 42.

Referring to FIGS. 5A-5D, a first gate dielectric layer 101L may be deposited on a top surface of the insulating layer 42 and on a top surface of the gate electrode 15. The first gate dielectric layer 101L may be formed by deposition of a first dielectric metal oxide such as hafnium oxide, zirconium oxide, hafnium zirconium oxide, yttrium oxide, lanthanum oxide, tantalum oxide, titanium oxide, strontium oxide, aluminum oxide, or an alloy thereof. The first gate dielectric material may be deposited by atomic layer deposition (ALD) or chemical vapor deposition (CVD). The thickness of the first gate dielectric layer 101L may be in a range from 1 nm to 100 nm, such as from 3 nm to 30 nm, although lesser and greater thicknesses may also be used. The upper limit on the thickness of the first gate dielectric layer 101L is imposed by reduction of the on-current due to an excessively thick gate dielectric. The lower limit on the thickness of the first gate dielectric layer 101L is imposed by an increase in the leakage current across a thin gate dielectric.

Referring to FIGS. 6A-6C, a photoresist layer 37 may be applied over a top surface of the first gate dielectric layer 101L, and may be lithographically patterned to form an opening that includes the area of the gate electrode 15. In one embodiment, the lithographically patterned photoresist layer 37 may have straight edges that overlie, or are adjacent to, sidewalls of the gate electrode 15 that laterally extend along the second horizontal direction hd2. In one embodiment, the opening in the patterned photoresist layer 37 may have a uniform width along the first horizontal direction hd1 that is invariant under translation along the second horizontal direction hd2. In one embodiment, the uniform width may be the same as, or may be less than, the width of the gate electrode 15 along the first horizontal direction hd1.

An etch process may be performed to remove a portion of the first gate dielectric layer 101L that is not masked by the patterned photoresist layer 37. In one embodiment, the etch process may comprise an isotropic etch process such as a wet etch process. In another embodiment, the etch process may comprise an anisotropic etch process such as a reactive ion etch process. In one embodiment, the physically exposed surfaces of the remaining portions of the patterned photoresist layer 37 may comprise tapered sidewalls having a taper angle in a range from 10 degrees to 80 degrees with respect to the vertical direction. The photoresist layer 37 may be subsequently removed, for example, by ashing. In one embodiment, a surface portion of the first gate dielectric layer 101L underlying the top surface of the first gate dielectric layer 101L may be collaterally recessed during removal of the photoresist layer 37. In this embodiment, the thickness of the first gate dielectric layer 101L may decrease by a recess distance, which may be in a range from 0.1 nm to 5 nm, such as from 0.2 nm to 2 nm.

Figure 7A:
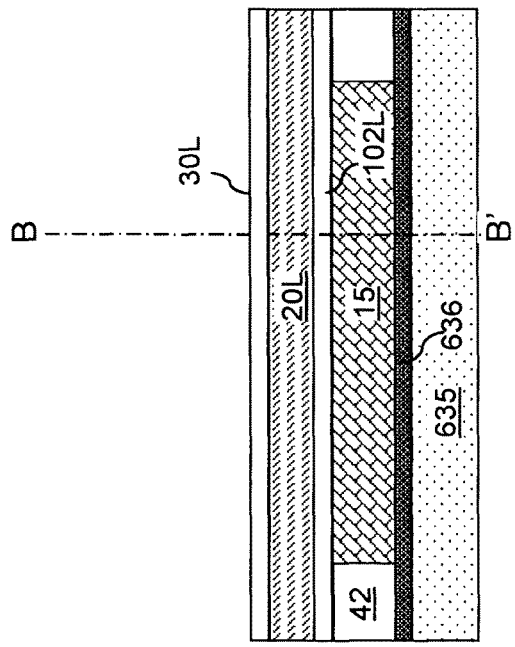
FIG. 7A is a top-down view of a region of the first exemplary structure after formation of a second gate dielectric layer, a continuous active layer, and a passivation capping dielectric layer according to the first embodiment of the present disclosure.
Figure 7B:
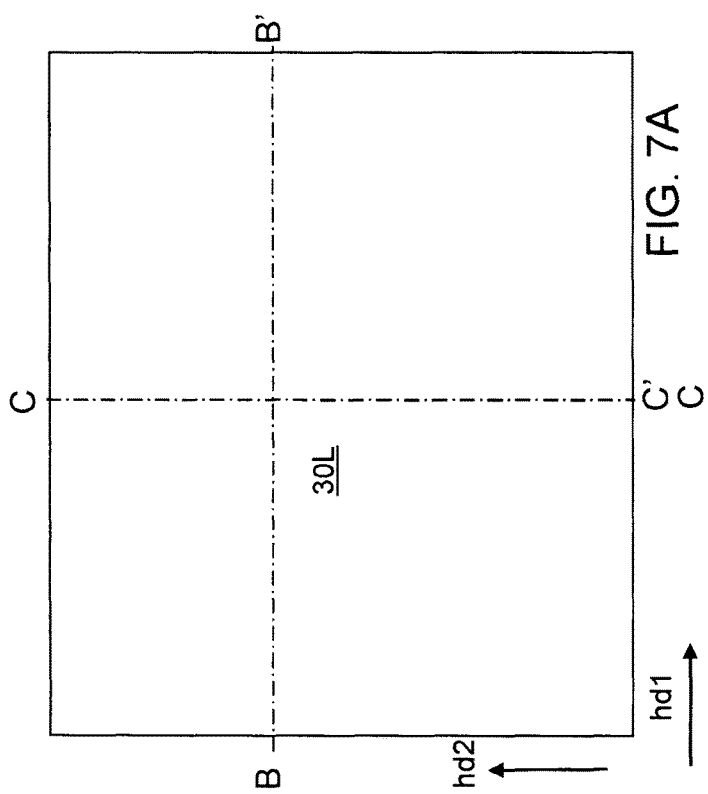
FIG. 7B is a vertical cross-sectional view of the first exemplary structure along the vertical plane B-B' of FIG. 7A.
Figure 7C:
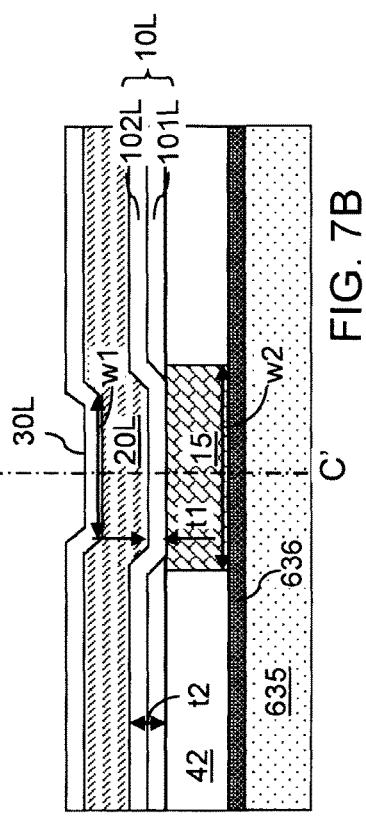
FIG. 7C is a vertical cross-sectional view of the first exemplary structure along the vertical plane C-C' of FIG. 7A.

Referring to FIGS. 7A-7C, a second gate dielectric layer 102L, a continuous active layer 20L, and a passivation capping dielectric layer 30L may be sequentially deposited. The second gate dielectric layer 102L may be deposited over, and directly on, patterned portions of the first gate dielectric layer 101L and on the top surface of the gate electrode 15. The second gate dielectric layer 102L may be formed by deposition of a second dielectric metal oxide material such as hafnium oxide, zirconium oxide, hafnium zirconium oxide, yttrium oxide, lanthanum oxide, tantalum oxide, titanium oxide, strontium oxide, aluminum oxide, or an alloy thereof. The second dielectric metal oxide material of the second gate dielectric layer 102L may be the same as, or may be different from, the first dielectric metal oxide of the first gate dielectric layer 101L. The second gate dielectric material may be deposited by atomic layer deposition (ALD) or chemical vapor deposition (CVD). The thickness of the second gate dielectric layer 102L may be in a range from 1 nm to 100 nm, such as from 3 nm to 30 nm, although lesser and greater thicknesses may also be used. The upper limit on the thickness of the second gate dielectric layer 102L may be imposed by reduction of the on-current due to an excessively thick gate dielectric. The lower limit on the thickness of the second gate dielectric layer 102L may be imposed by an increase in the leakage current across a thin gate dielectric.

The layer stack of the first gate dielectric layer 101L and the second gate dielectric layer 102L is collectively referred to as a gate dielectric layer 10L. The gate dielectric layer 10L has a first region (which is herein referred to as a center gate dielectric portion) having a first thickness t1 and overlying, and contacting, the gate electrode 15, and has second regions (which are herein referred to as peripheral gate dielectric portions) having a second thickness t2 and overlying, and contacting, the insulating layer 42. In one embodiment, the first thickness t1 is the same as the thickness of the second gate dielectric layer 102L, and may be in a range from 1 nm to 100 nm. The second thickness t2 is the same as the sum of the thickness of the first gate dielectric layer 101L and the thickness of the second gate dielectric layer 102L. In one embodiment, the second thickness t2 may be in a range from 2 nm to 200 nm, such as from 6 nm to 60 nm, although lesser and greater thicknesses may also be used. The lower limit on the second thickness t2 may be imposed by the efficiency of the portions of the gate dielectric layer 10L overlying the insulating layer 42 for the purpose of blocking hydrogen diffusion from the insulating layer 42. The upper limit on the second thickness t2 may be imposed by the need to maintain high the on-current of a thin film transistor to be subsequently formed.

The continuous active layer 20L may be deposited over gate dielectric layer 10L. The continuous active layer 20L comprises, and/or consists essentially of, a compound semiconductor material. In one embodiment, the continuous active layer 20L includes a semiconducting metal oxide material providing electrical conductivity in a range from 1.0 S/cm to $1.0 \times 10^5$ S/cm upon suitable doping with electrical dopants (which may be p-type dopants or n-type dopants).

Exemplary semiconducting metal oxide materials that may be used for the continuous active layer include, but are not limited to, quaternary compounds such as indium gallium zinc oxide (IGZO), indium tungsten zinc oxide, tin gallium zinc oxide, and tin tungsten zinc oxide, and ternary compounds such as indium tin oxide, indium gallium oxide, indium zinc oxide, indium tungsten oxide, tin gallium oxide, and tin tungsten oxide, and quinary compounds such as indium gallium zinc tin oxide. In one embodiment, the semiconducting metal oxide material of the continuous active layer 20L may include an heavy-post-transition-metal-containing oxide material or a plurality of heavy-post-transition-metal-containing oxide materials.

As used herein, post-transition metal elements refer to metal elements that are not alkali metals, alkaline earth metals, outer transition metals, or inner transition metals (i.e., Lanthanides and Actinides). Thus, post-transition metal elements include aluminum, zinc, gallium, cadmium, indium tin, mercury, thallium, lead, bismuth, and polonium. Light post-transition metal elements include aluminum, zinc, and gallium. Heavy post-transition metal elements include cadmium, indium tin, mercury, thallium, lead, bismuth, and polonium.

The continuous active layer 20L may include an amorphous semiconducting metal oxide material. In one embodiment, the continuous active layer 20L may be formed by depositing multiple iterations of a unit layer stack deposition process. Each unit layer stack deposition process includes an acceptor-type oxide deposition process that deposits an oxide of an acceptor-type element selected from gallium (Ga) and tungsten (W) may be may be in the form of an acceptor-type oxide layer, a post-transition metal oxide deposition process that deposits an oxide of a heavy post-transition metal element selected from In and Sn in the form of a post-transition metal oxide layer, and optionally includes a zinc oxide deposition process that deposits zinc oxide in the form of a zinc oxide layer. The thickness of the continuous active layer 20L may be in a range from 3 nm to 100 nm, such as from 5 nm to 50 nm and/or from 10 nm to 30 nm, although lesser and greater thicknesses may also be used.

In one embodiment, a portion of the bottom surface of the continuous active layer 20L may be vertically recessed over the center gate dielectric portion of the gate dielectric layer 10L relative to portions of the bottom surface of the continuous active layer 20L overlying the peripheral gate dielectric portions of the gate dielectric layer 10L. A portion of the top surface of the continuous active layer 20L overlying the center gate dielectric portion of the gate dielectric layer 10L is vertically recessed relative to portions of the top surface of the active layer that overlie the interface between the gate dielectric layer 10L and the insulating layer 42. The recessed portion of the top surface of the continuous active layer 20L overlying the center gate dielectric portion of the gate dielectric layer 10L may have a first width w1 along the first horizontal direction hd1. The gate electrode 15 may have a second width w2 along the first horizontal direction hd1. In one embodiment, the first width w1 may be the same as, or may be less than, the second width w2. In this embodiment, the width of the center gate dielectric portion of the gate dielectric layer 10L may be less than the width of the gate electrode 15 (i.e., the second width w2), and the peripheral gate dielectric portions of the gate dielectric layer 10L may provide sufficient hydrogen blocking in regions that are proximal to sidewalls of the gate electrode 15 to prevent ingress of hydrogen atoms into the semiconducting metal oxide material of the continuous active layer 20L.

A passivation capping dielectric layer 30L comprising, and/or consisting essentially of, a dielectric metal oxide material may be formed over the continuous active layer 20L. The passivation capping dielectric layer 30L may be formed by deposition of a third dielectric metal oxide such as hafnium oxide, zirconium oxide, hafnium zirconium oxide, yttrium oxide, lanthanum oxide, tantalum oxide, titanium oxide, strontium oxide, aluminum oxide, or an alloy thereof. The third dielectric metal oxide of the passivation capping dielectric layer 30L may be the same as, or may be different from, the first dielectric metal oxide of the first gate dielectric layer 101L. The third dielectric metal oxide of the passivation capping dielectric layer 30L may be the same as, or may be different from, the second dielectric metal oxide material of the second gate dielectric layer 102L. The third gate dielectric material may be deposited by atomic layer deposition (ALD) or chemical vapor deposition (CVD). The thickness of the passivation capping dielectric layer 30L may be in a range from 1 nm to 200 nm, such as from 3 nm to 100 nm, although lesser and greater thicknesses may also be used. The upper limit on the thickness of the passivation capping dielectric layer 30L may be imposed by the duration of a subsequent anisotropic etch process to be used to form a source cavity and a drain cavity. The lower limit on the thickness of the passivation capping dielectric layer 30L may be imposed by the efficiency of the passivation capping dielectric layer 30L as a hydrogen-blocking structure. In other words, the passivation capping dielectric layer 30L needs to be thick enough to effectively block diffusion therethrough of hydrogen atoms, oxygen atoms, and water molecules. The passivation capping dielectric layer 30L contacts the top surface of the continuous active layer 20L. Optionally, the continuous active layer 20L and the passivation capping dielectric layer 30L may be formed in a same process chamber.

Figure 8A:
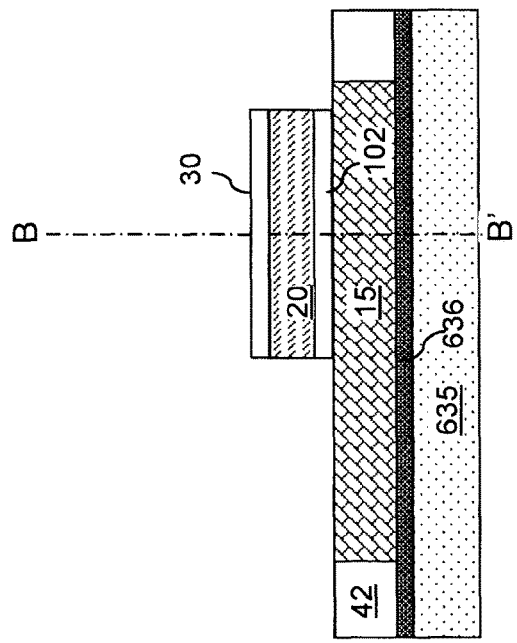
FIG. 8A is a top-down view of a region of the first exemplary structure after formation of a passivation capping dielectric, an active layer, and a gate dielectric according to the first embodiment of the present disclosure.
Figure 8B:
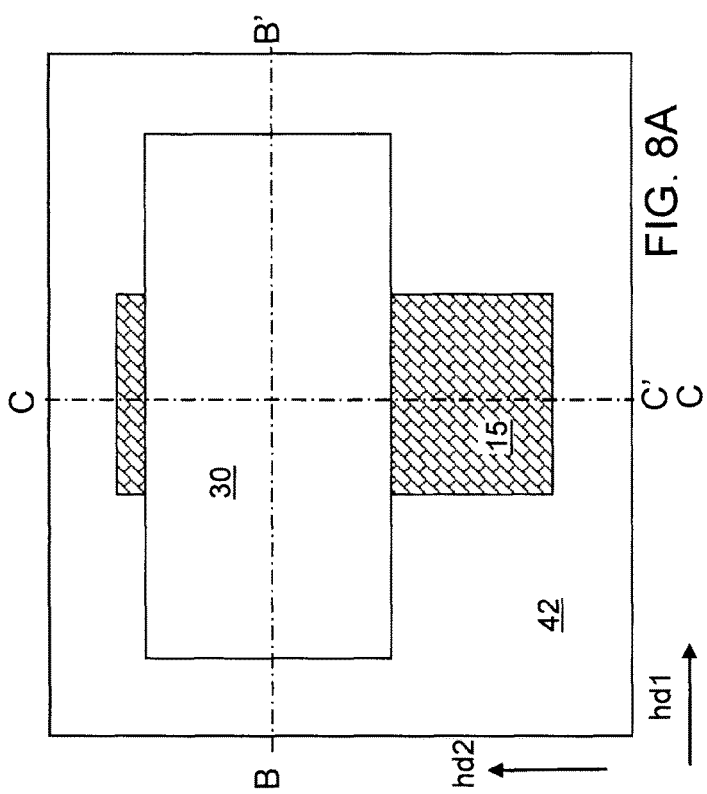
FIG. 8B is a vertical cross-sectional view of the first exemplary structure along the vertical plane B-B' of FIG. 8A.
Figure 8C:
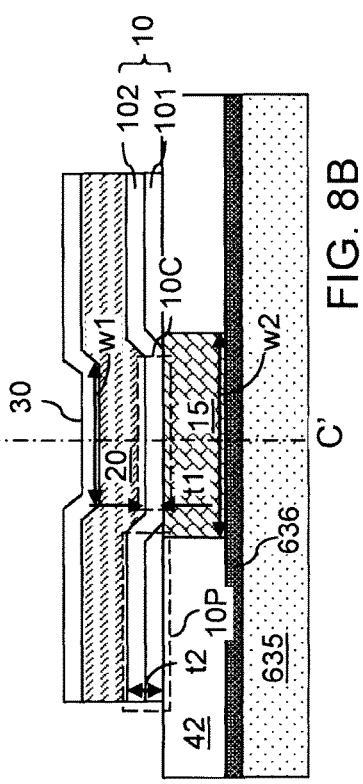
FIG. 8C is a vertical cross-sectional view of the first exemplary structure along the vertical plane C-C' of FIG. 8A.

Referring to FIGS. 8A-8C, a photoresist layer (not shown) may be applied over the passivation capping dielectric layer 30L, and may be lithographically patterned to form discrete patterned photoresist material portions straddling a respective gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the passivation capping dielectric layer 30L, the continuous active layer 20L, and the gate dielectric layer 10L by performing an anisotropic etch process. Each patterned portion of the passivation capping dielectric layer 30L includes a passivation capping dielectric 30. Each patterned portion of the continuous active layer 20L includes an active layer 20. Each patterned portion of the gate dielectric layer 10L includes a gate dielectric 10.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a vertical stack of a gate electrode 15, a gate dielectric 10, an active layer 20, and a passivation capping dielectric 30 may be formed over lower-level dielectric layers (601, 610, 620) that overlies a substrate 8. The sidewalls of the gate dielectric 10 and the active layer 20 may be vertically coincident, i.e., may be located within same vertical planes. The photoresist layer may be subsequently removed, for example, by ashing.

Sidewalls of the gate dielectric 10 may be vertically coincident with sidewalls of the active layer 20 and sidewalls of the passivation capping dielectric 30. As used herein, a first surface is vertically coincident with a second surface if the first surface overlies or underlies the second surface and if a vertical plane including the first surface and the second surface exists.

In one embodiment, the gate dielectric 10 comprises a center gate dielectric portion 10C having a first thickness t1 and contacting a top surface of the gate electrode 15, and a pair of peripheral gate dielectric portions 10P having a second thickness t2 that is greater than the first thickness t1 and contacting a top surface of the insulating layer 42. The pair of peripheral gate dielectric portions 10P may be laterally spaced apart from each other by the center gate dielectric portion 10C. In one embodiment, bottom surfaces of the pair of peripheral gate dielectric portions 10P and a bottom surface of the center gate dielectric portion 10C may be located within a same horizontal plane, which may include an interface between the gate dielectric 10 and gate electrode 15 and an interface between the gate dielectric 10 and the insulating layer 42.

The remaining portions of the first gate dielectric layer 101L comprise a first gate dielectric 101. The remaining portion of the second gate dielectric layer 102L comprises a second gate dielectric 102. The stack of the first gate dielectric 101 and the second gate dielectric 102 constitute the gate dielectric 10.

In one embodiment, the gate dielectric 10 may comprise a pair of taper regions having a variable thickness and connecting the center gate dielectric portion 10C to a respective one of the peripheral gate dielectric portions 10P. Each of the pair of taper regions has a tapered top surface that contacts a tapered bottom surface of the active layer 20. The gate dielectric 10 comprises a pair of variable thickness portions overlying peripheral portions of the gate electrode 15 within the pair of taper regions.

In one embodiment, the bottom surface of the passivation capping dielectric 30 comprises a pair of tapered surface segments contacting tapered top surface segments of the active layer 20, and a horizontal bottom surface segment adjoined to bottom edges of the pair of tapered surface segments and contacting a horizontal surface segment of the active layer 20, which is a recessed surface having the first width w1.

Figure 9C:
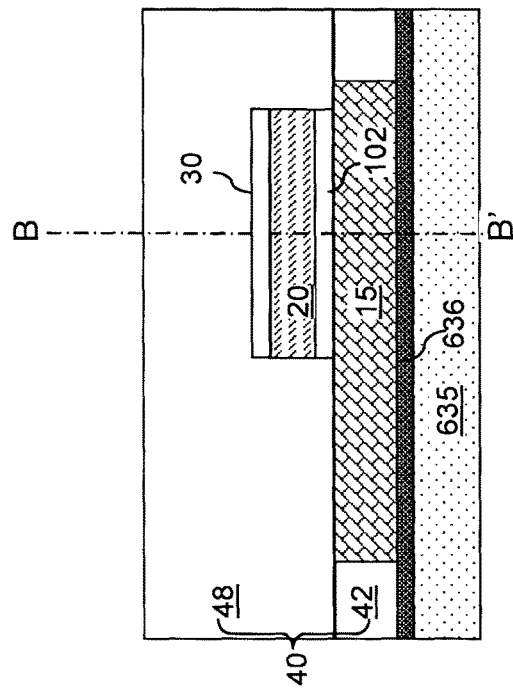
FIG. 9C is a vertical cross-sectional view of the first exemplary structure along the vertical plane C-C' of FIG. 9A.
Figure 9A:
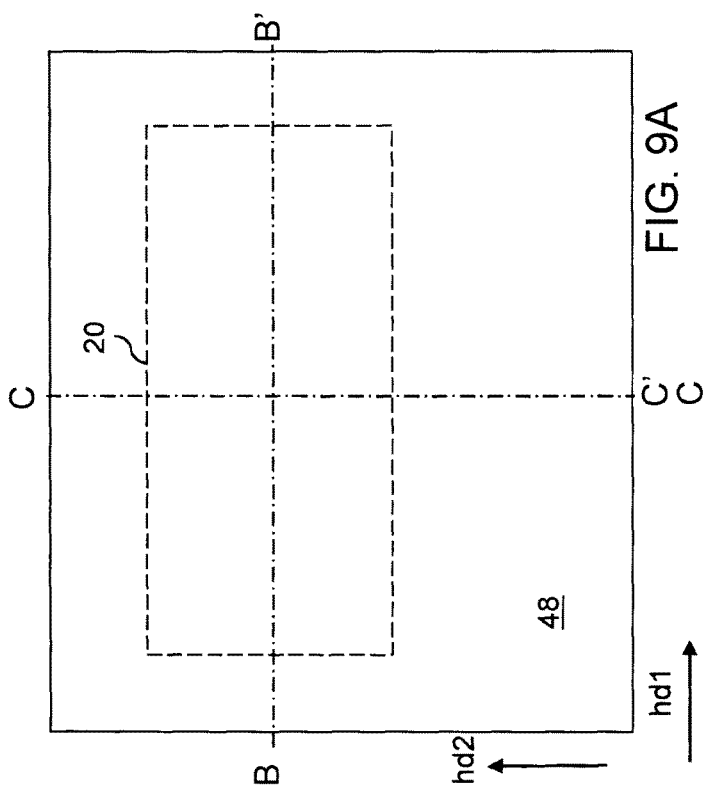
FIG. 9A is a top-down view of a region of the first exemplary structure after formation of a dielectric layer according to the first embodiment of the present disclosure.
Figure 9B:
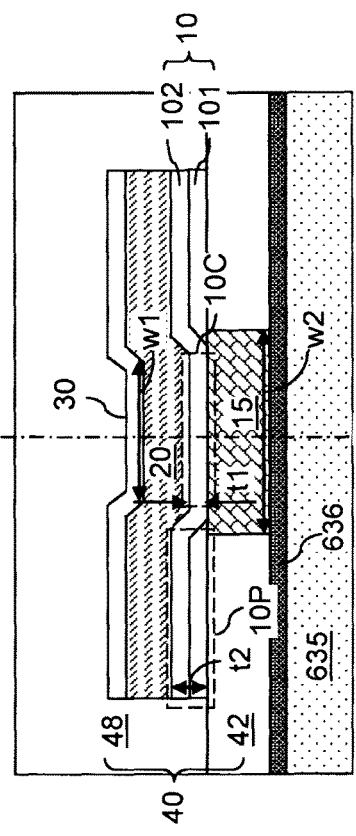
FIG. 9B is a vertical cross-sectional view of the first exemplary structure along the vertical plane B-B' of FIG. 9A.

Referring to FIGS. 9A-9C, a dielectric layer 48 may be deposited over the passivation capping dielectric 30. The dielectric layer 48 is also referred to as an electrode-level dielectric layer. The dielectric layer 48 includes a dielectric material such as undoped silicate glass, a doped silicate glass, organosilicate glass, silicon oxynitride, or a stack thereof. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors. The dielectric layer 48 may comprise the same dielectric material as, or may comprise a different dielectric material from, the dielectric material of the insulating layer 42. The thickness of the dielectric layer 48 as measured from above the passivation capping dielectric 30 may be in a range from 1 nm to 1,000 nm, such as from 10 nm to 500 nm, and/or from 100 nm to 300 nm, although lesser and greater thicknesses may also be used.

Referring to FIGS. 10A-10C, a photoresist layer 47 may be applied over the TFT-level dielectric layer 40, and may be lithographically patterned to form discrete openings therein. The pattern of the openings in the photoresist layer 47 include a pair of openings overlying end portions of the active layer 20, and an opening overlaying a portion of the gate electrode 15 that is not covered by the active layer 20. The lateral spacing between the pair of openings in the photoresist layer 47 is herein referred to as a third width w3.

Referring to FIGS. 11A-11C, the pattern of the discrete openings in the photoresist layer may be transferred through the dielectric layer 48 and the passivation capping dielectric 30 by an anisotropic etch process to form a source cavity 51, a drain cavity 59, and a gate contact via cavity 19. The lateral spacing between the source cavity 51 and the drain cavity 59 may be the third width w3, which may be greater than the first width w1, and may be the same as, greater than, or less than, the second width w2. The anisotropic etch process may be selective to the materials of the active layer 20 and the gate electrode 15. However, due to finite selectivity of the anisotropic etch process used to form the source cavity 51 and the drain cavity 59, surfaces of the active layer 20 may be vertically recessed underneath the source cavity 51 and the drain cavity 59. The vertical recess distance may be in a range from 0.1 nm to 6 nm, such as from 0.3 nm to 3 nm, although lesser and greater vertical recess distances may also be used. The photoresist layer 47 may be subsequently removed, for example, by ashing.

Referring to FIGS. 12A-12C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The thickness of the metallic liner may be in a range from 1 nm to 100 nm, such as from 3 nm to 30 nm, although lesser and greater thicknesses may also be used. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a gate contact metallic liner 16 that is a remaining portion of the metallic liner material, and a gate contact metallic fill material portion 17 that is a remaining portion of the metallic fill material. The height of the source metallic fill material portion 54 and the drain metallic fill material portion 58 may be in a range from 1 nm to 1,000 nm, such as from 10 nm to 300 nm, and/or from 30 nm to 100 nm, although lesser and greater heights may also be used.

Generally, the source electrode 52 and the drain electrode 56 may be formed through the passivation capping dielectric 30 on a respective surface segment of the active layer 20. The source electrode 52 and the drain electrode 56 may be formed on peripheral portions of the active layer 20, and are laterally spaced from each other by the gate electrode 15. The source electrode 52 contacts a first end portion of the active layer 20, and the drain electrode 56 contacts a second end portion of the active layer 20.

The passivation capping dielectric 30 may include, and/or consists essentially of, a dielectric metal oxide material, and may contact a top surface of the active layer 20. The passivation capping dielectric 30 may laterally extend between, and contact sidewalls of, the source electrode 52 and the drain electrode 56.

The dielectric layer 48 may laterally surround the active layer 20, the source electrode 52, the drain electrode 58, and may contact the entirety of a top surface of the passivation capping dielectric 30. The top surface of the active layer 20 may be vertically recessed over the center gate dielectric portion 10C relative to horizontal surfaces of the active layer 20 that contact a sidewall of the source electrode 52 or a sidewall of the drain electrode 56. In one embodiment, the top surfaces of the source electrode 52 and the drain electrode 56 are located within a same horizontal plane as a top surface of the dielectric layer.

Figure 13C:
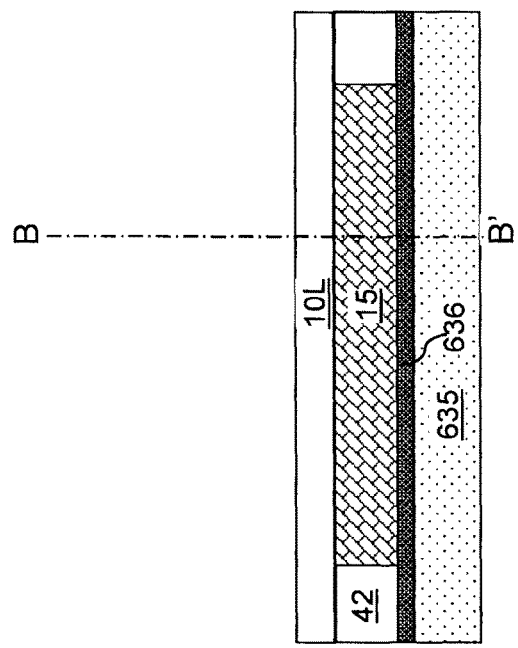
FIG. 13C is a vertical cross-sectional view of the second exemplary structure along the vertical plane C-C' of FIG. 13A.
Figure 13A:
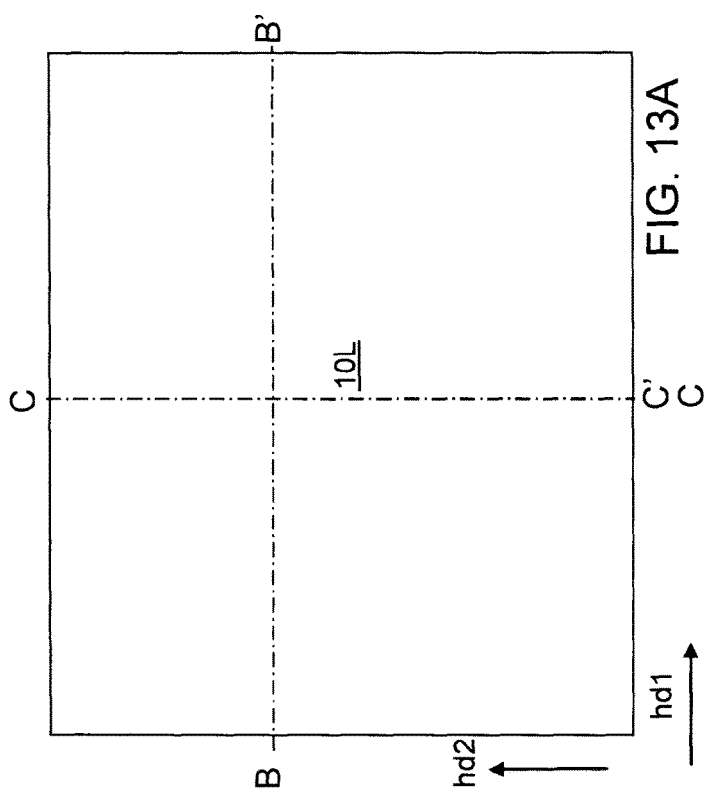
FIG. 13A is a top-down view of a region of a second exemplary structure after formation of a gate dielectric layer according to a second embodiment of the present disclosure.
Figure 13B:
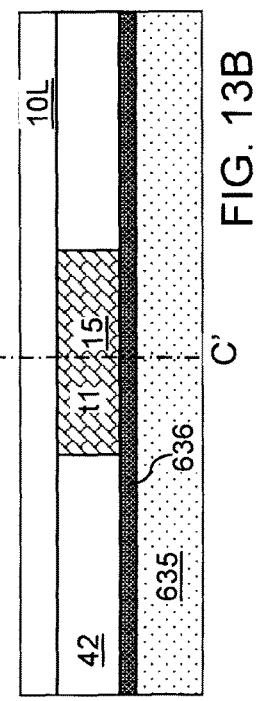
FIG. 13B is a vertical cross-sectional view of the second exemplary structure along the vertical plane B-B' of FIG. 13A.

Referring to FIGS. 13-13C, a second exemplary structure according to a second embodiment of the present disclosure may be derived from the first exemplary structure illustrated in FIGS. 4A-4C by forming a gate dielectric layer 10L on a top surface of the insulating layer 42 and on a top surface of the gate electrode 15. The gate dielectric layer 10L may be formed by deposition of a first dielectric metal oxide such as hafnium oxide, zirconium oxide, hafnium zirconium oxide, yttrium oxide, lanthanum oxide, tantalum oxide, titanium oxide, strontium oxide, aluminum oxide, or an alloy thereof. The gate dielectric material may be deposited by atomic layer deposition (ALD) or chemical vapor deposition (CVD). The thickness of the gate dielectric layer 10L may be in a range from 1 nm to 200 nm, such as from 6 nm to 100 nm, although lesser and greater thicknesses may also be used. The upper limit on the thickness of the gate dielectric layer 10L may be imposed by reduction of the on-current due to an excessively thick gate dielectric. The lower limit on the thickness of the gate dielectric layer 10L may be imposed by an increase in the leakage current across a thin gate dielectric.

Referring to FIGS. 14A-14C, a photoresist layer 37 may be applied over a top surface of the gate dielectric layer 10L, and may be lithographically patterned to form an opening that includes the area of the gate electrode 15. In one embodiment, the lithographically patterned photoresist layer 37 may have straight edges that overlie, or are adjacent to, sidewalls of the gate electrode 15 that laterally extend along the second horizontal direction hd2. In one embodiment, the opening in the patterned photoresist layer 37 may have a uniform width along the first horizontal direction hd1 that is invariant under translation along the second horizontal direction hd2. In one embodiment, the uniform width may be the same as, or may be less than, the width of the gate electrode 15 along the first horizontal direction hd1.

A recess etch process may be performed to remove a portion of the gate dielectric layer 10L that is not masked by the patterned photoresist layer 37. An unmasked portion of the gate dielectric layer 10L may be thinned by providing an etchant that etches the material of the gate dielectric layer 10L through the opening in the patterned photoresist layer 37. In one embodiment, the recess etch process may comprise an isotropic etch process such as a wet etch process. In another embodiment, the recess etch process may comprise an anisotropic etch process such as a reactive ion etch process. According to an aspect of the present disclosure, the duration of the recess etch process is controlled such that an unmasked portion of the gate dielectric layer 10L has a lesser thickness (which is herein referred to as a first thickness t1) that is less than the initial thickness of the gate dielectric layer 10L (which is herein referred to as a second thickness t2).

In one embodiment, the physically exposed surfaces of the remaining portions of the patterned photoresist layer 37 may comprise tapered sidewalls having a taper angle in a range from 10 degrees to 80 degrees with respect to the vertical direction. The photoresist layer 37 may be subsequently removed, for example, by ashing. In one embodiment, the first thickness t1 may be in a range from 1 nm to 100 nm. A center portion (i.e., a center gate dielectric portion) of the gate dielectric layer 10L is thinned. In one embodiment, the thinned center portion of the gate dielectric layer 10L may have a width that is the same as, or is less than, the width of the underlying gate electrode 15 along the first horizontal direction hd1.

Figure 15C:
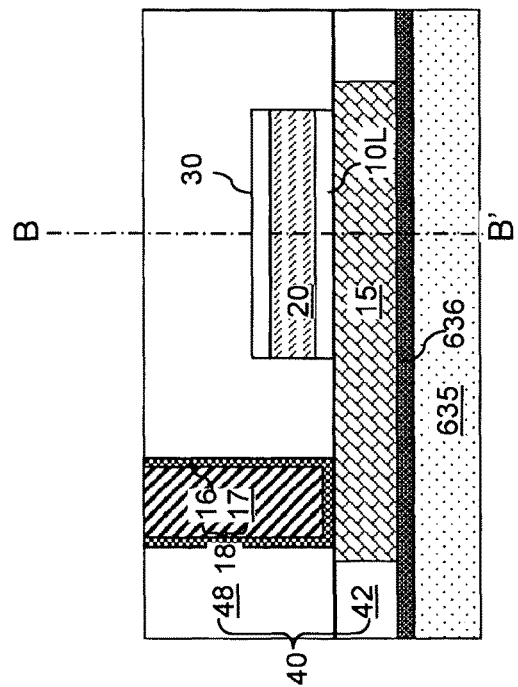
FIG. 15C is a vertical cross-sectional view of the second exemplary structure along the vertical plane C-C' of FIG. 15A.
Figure 15A:
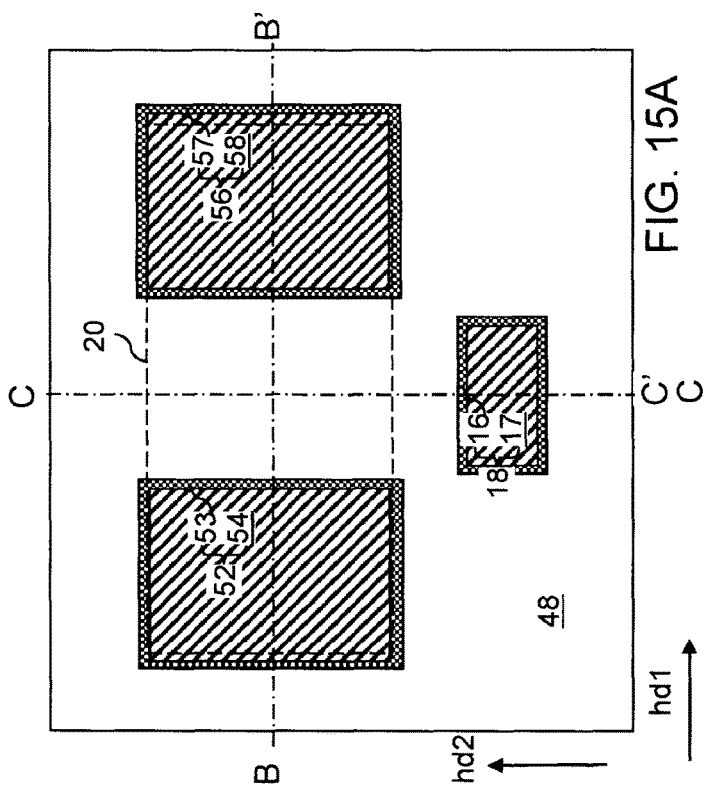
FIG. 15A is a top-down view of a region of the second exemplary structure after formation of a source electrode, a drain electrode, and a backside electrode contact via structure according to the second embodiment of the present disclosure.
Figure 15B:
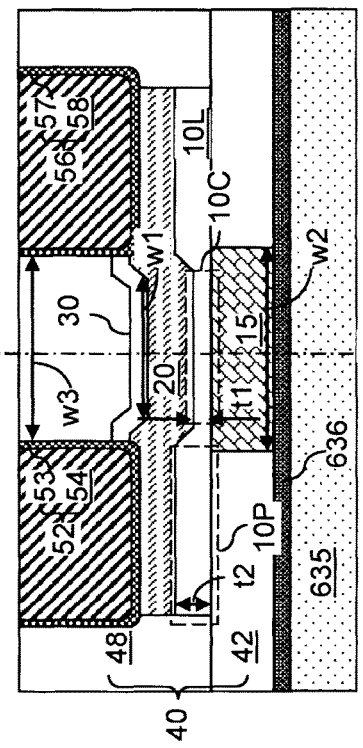
FIG. 15B is a vertical cross-sectional view of the second exemplary structure along the vertical plane B-B' of FIG. 15A.

Referring to FIGS. 15A-15C, a continuous active layer 20L and a passivation capping dielectric layer 30L may be formed over the gate dielectric layer 10L by performing the processing steps of FIGS. 7A-7C. Subsequently, the processing steps of FIGS. 8A-12C may be performed to provide the second exemplary structure illustrated in FIGS. 15A-15C, which may have the same structural characteristics as the first exemplary structure illustrated in FIGS. 12A-12C except that the gate dielectric 10 has a homogenous material composition throughout and is free of any internal interface therein (such as an interface between a first gate dielectric 101 and a second gate dielectric 102 that is present within the first exemplary structure of FIGS. 12A-12C).

Generally, the gate dielectric layer 10L may be patterned into the gate dielectric 10 such that sidewalls of the gate dielectric 10 are vertically coincident with sidewalls of the active layer 20 and sidewalls of the passivation capping dielectric 30. The gate dielectric 10 has a same dielectric metal oxide material composition throughout. The gate dielectric 10 comprises a center gate dielectric portion 10C having a first thickness t1 and contacting a top surface of the gate electrode 15, and a pair of peripheral gate dielectric portions 10P having a second thickness t2 that is greater than the first thickness t1, contacting a top surface of the insulating layer 42, and laterally spaced apart from each other by the center gate dielectric portion 10C.

Figure 16C:
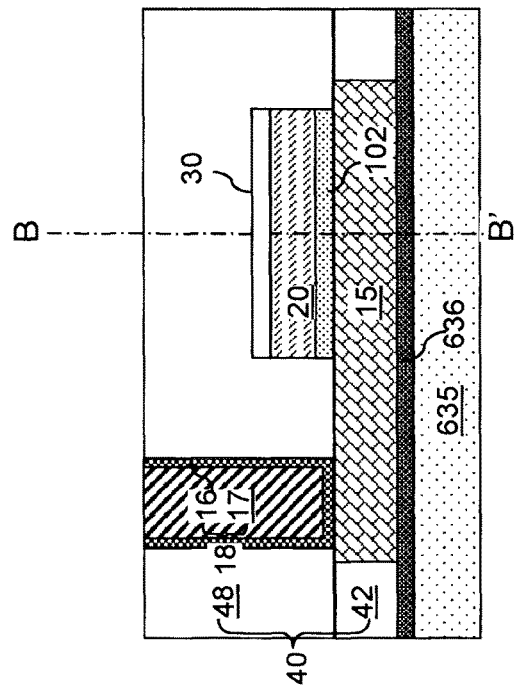
FIG. 16C is a vertical cross-sectional view of the third exemplary structure along the vertical plane C-C' of FIG. 16A.
Figure 16A:
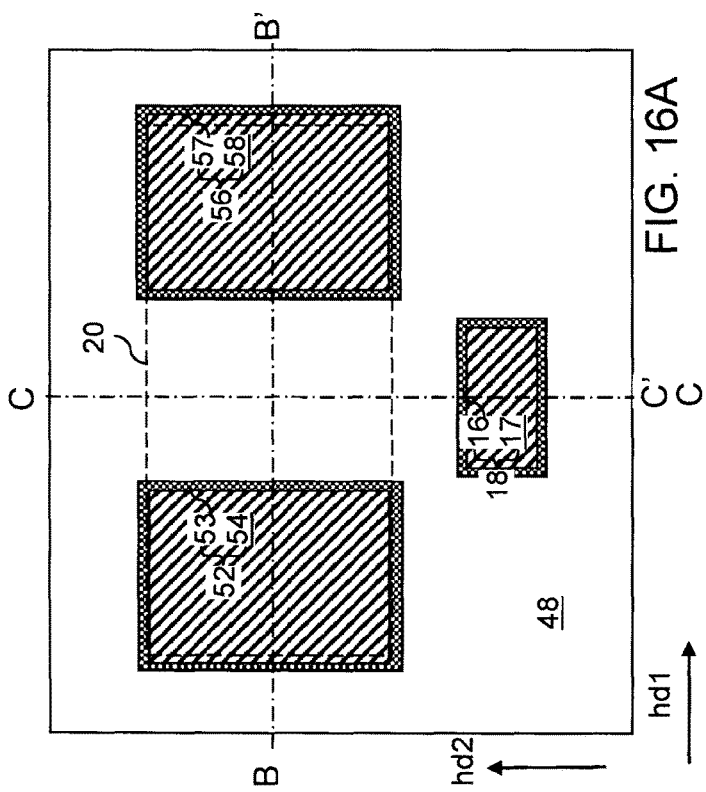
FIG. 16A is a top-down view of a region of a third exemplary structure according to a third embodiment of the present disclosure.
Figure 16B:
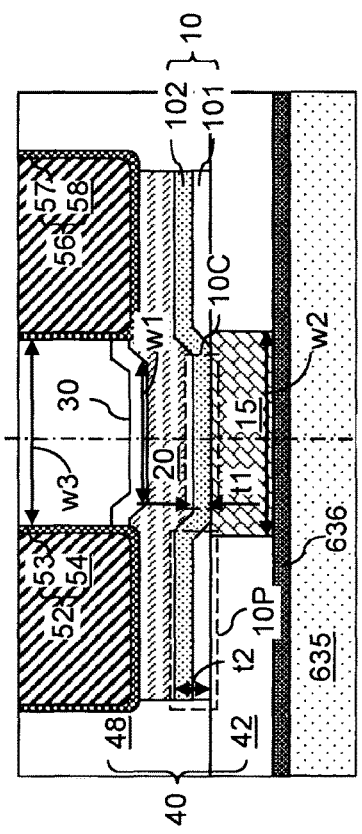
FIG. 16B is a vertical cross-sectional view of the third exemplary structure along the vertical plane B-B' of FIG. 16A.

Referring to FIGS. 16-16C, a third exemplary structure according to a third embodiment of the present disclosure may be derived from the first exemplary structure illustrated in FIGS. 12A-12C by using a different dielectric metal oxide material for the second gate dielectric 102 than for the first gate dielectric 101. In other words, the second dielectric metal oxide material of the second gate dielectric 102 is different from the first dielectric metal oxide material of the first gate dielectric 101. In one embodiment, the thickness and the material composition of the second gate dielectric 102 may be selected to optimize performance of the thin film transistor, and the thickness and the material composition of the first gate dielectric 101 may be selected to enhance blocking of hydrogen, oxygen, and water molecules therethrough. For example, the first gate dielectric 101 may include lanthanum oxide or yttrium oxide, and the second gate dielectric 102 may include hafnium.

In this embodiment, the gate dielectric 10 may include a pair of first gate dielectric portions that are portions of the first gate dielectric 101, located in the pair of peripheral gate dielectric portions 10P, comprising a first dielectric metal oxide material, and laterally spaced apart by the center gate dielectric portion 10C, and includes a second gate dielectric portion (i.e., the second gate dielectric 102) continuously extending across the pair of peripheral gate dielectric portions 10P and the center gate dielectric portion 10C and comprising a second dielectric metal oxide material having a different material composition than the first dielectric metal oxide material. In one embodiment, the second gate dielectric portion contacts the top surface of the gate electrode 15, and contacts top surfaces of the pair of first gate dielectric portions.

In one embodiment, the gate dielectric 10 includes a pair of taper regions having a variable thickness and overlying peripheral portions of the gate electrode 15. Generally, the gate dielectric includes a dielectric metal oxide material of the second gate dielectric 102, and at least one additional dielectric metal oxide material, which may be a plurality of dielectric metal oxide materials, of the first gate dielectric 101. In embodiments in which the first gate dielectric 101 includes a plurality of dielectric metal oxide materials, a layer stack of multiple dielectric metal oxide layers may be used for the first gate dielectric 101.

In one embodiment, the third dielectric metal oxide material of the passivation capping dielectric 30 may have a same material composition as one of the at least one additional dielectric metal oxide material of the first gate dielectric 101, or may have a material composition that is different from any of the at least one additional dielectric metal oxide material of the first gate dielectric 101. The third dielectric metal oxide material of the passivation capping dielectric 30 may have a same material composition as the second dielectric metal oxide material of the second gate dielectric 102, or may have a material composition that is different from the second dielectric metal oxide material of the second gate dielectric 102. In one embodiment, the third dielectric metal oxide material of the passivation capping dielectric 30 may have a same material composition as one of the first gate dielectric 101 and the second gate dielectric 102.

Figure 17A:
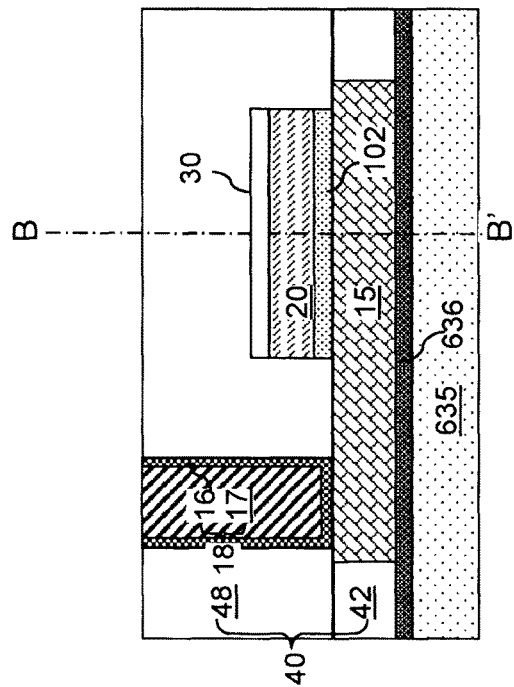
FIG. 17A is a top-down view of a region of a fourth exemplary structure according to a fourth embodiment of the present disclosure.
Figure 17B:
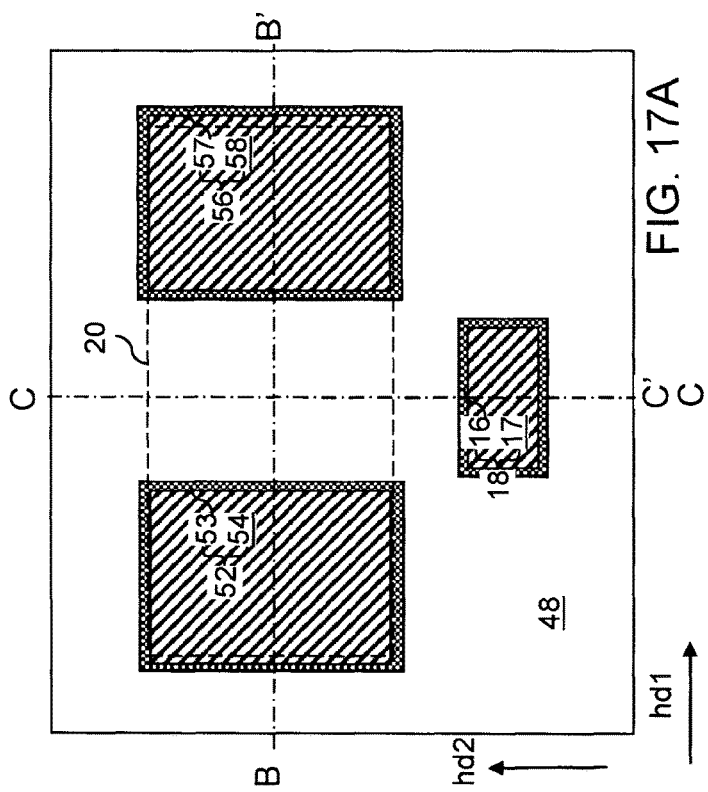
FIG. 17B is a vertical cross-sectional view of the fourth exemplary structure along the vertical plane B-B' of FIG. 17A.
Figure 17C:
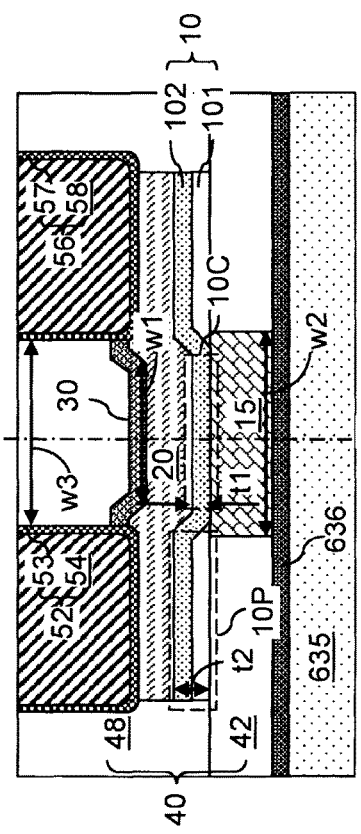
FIG. 17C is a vertical cross-sectional view of the fourth exemplary structure along the vertical plane C-C' of FIG. 17A.

Referring to FIGS. 17A-17C, a fourth exemplary structure according to a fourth embodiment of the present disclosure may be derived from the first exemplary structure illustrated in FIGS. 12A-12C by using different materials for each of the first gate dielectric 101, the second gate dielectric 102, and the passivation capping dielectric 30. In other words, the first dielectric metal oxide material of the first gate dielectric 101, the second dielectric metal oxide material of the second gate dielectric 102, and the third dielectric metal oxide material of the passivation capping dielectric 30 are different from one another. For example, the first gate dielectric 101 may include one of titanium oxide, tantalum oxide, yttrium oxide, and lanthanum oxide, the second gate dielectric 102 may include hafnium oxide, and the passivation capping dielectric 30 may include another of titanium oxide, tantalum oxide, yttrium oxide, and lanthanum oxide.

Figure 18C:
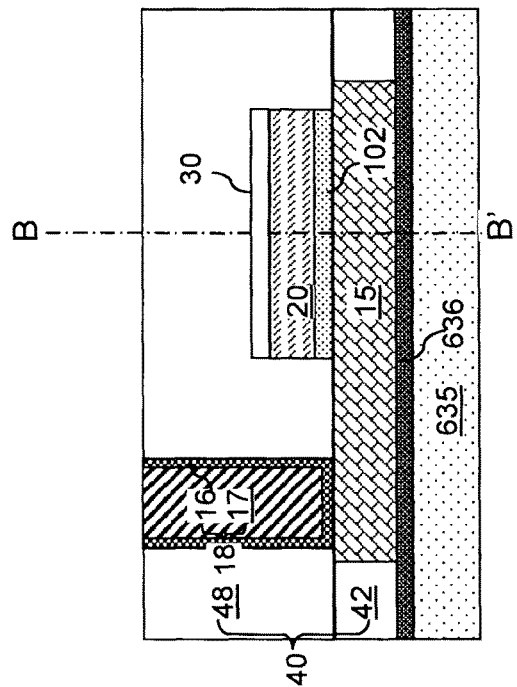
FIG. 18C is a vertical cross-sectional view of the fourth exemplary structure along the vertical plane C-C' of FIG. 18A.
Figure 18A:
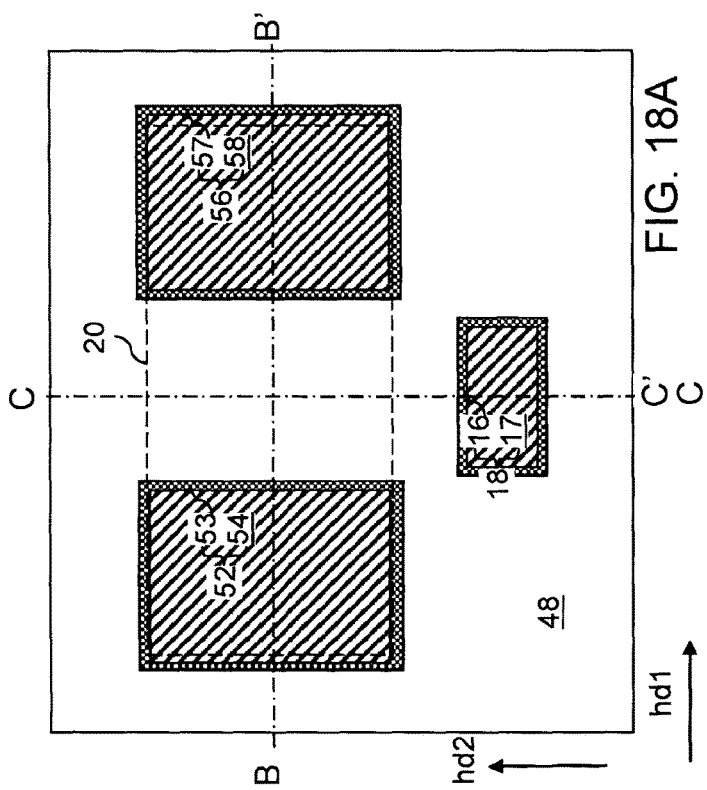
FIG. 18A is a top-down view of a region of a first alternative embodiment of the fourth exemplary structure according to the fourth embodiment of the present disclosure.
Figure 18B:
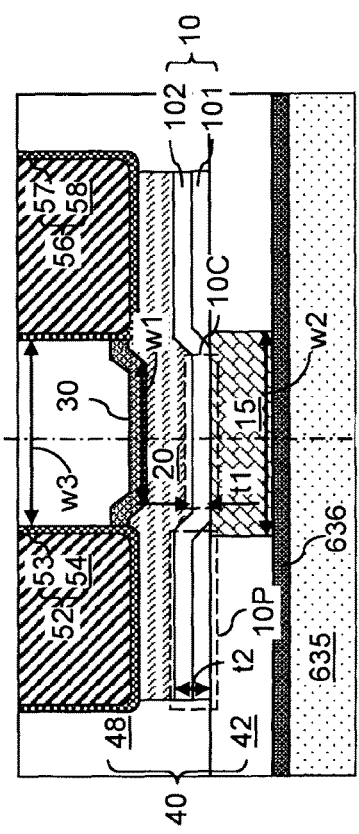
FIG. 18B is a vertical cross-sectional view of the fourth exemplary structure along the vertical plane B-B' of FIG. 18A.

Referring to FIGS. 18A-18C, a first alternative configuration of the fourth exemplary structure according to the fourth embodiment of the present disclosure may be derived from the fourth exemplary structure illustrated in FIGS. 17A-17C by using a same dielectric metal oxide material for the first gate dielectric 101 and the second gate dielectric 102. For example, the first gate dielectric 101 and the second gate dielectric 102 may include hafnium oxide, and the passivation capping dielectric 30 may include one of titanium oxide, tantalum oxide, yttrium oxide, and lanthanum oxide.

Referring to FIGS. 19A-19C, a second alternative configuration of the fourth exemplary structure according to the fourth embodiment of the present disclosure may be derived from the fourth exemplary structure illustrated in FIGS. 17A-17C by using a same dielectric metal oxide material for the second gate dielectric 102 and the passivation capping dielectric 30. For example, the first gate dielectric 101 may include one of titanium oxide, tantalum oxide, yttrium oxide, and lanthanum oxide, and the second gate dielectric 102 and the passivation capping dielectric may include hafnium oxide.

Referring to FIGS. 20A-20C, a fifth exemplary structure according to a fifth embodiment of the present disclosure may be derived from any of the previously described exemplary structures by laterally spacing the source electrode 52 and the drain electrode 56 such that the third width w3, i.e., the lateral spacing between the source electrode 52 and the drain electrode 56, is greater than the second width w2, i.e., the width of the gate electrode 15 along the first horizontal direction hd1. The fifth exemplary structure may be used to provide a thin film transistor having a lower leakage current.

Figure 21C:
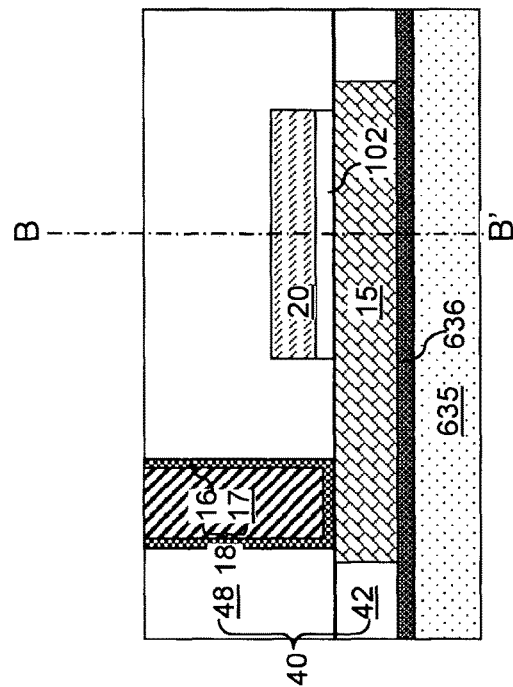
FIG. 21C is a vertical cross-sectional view of the sixth exemplary structure along the vertical plane C-C' of FIG. 21A.
Figure 21A:
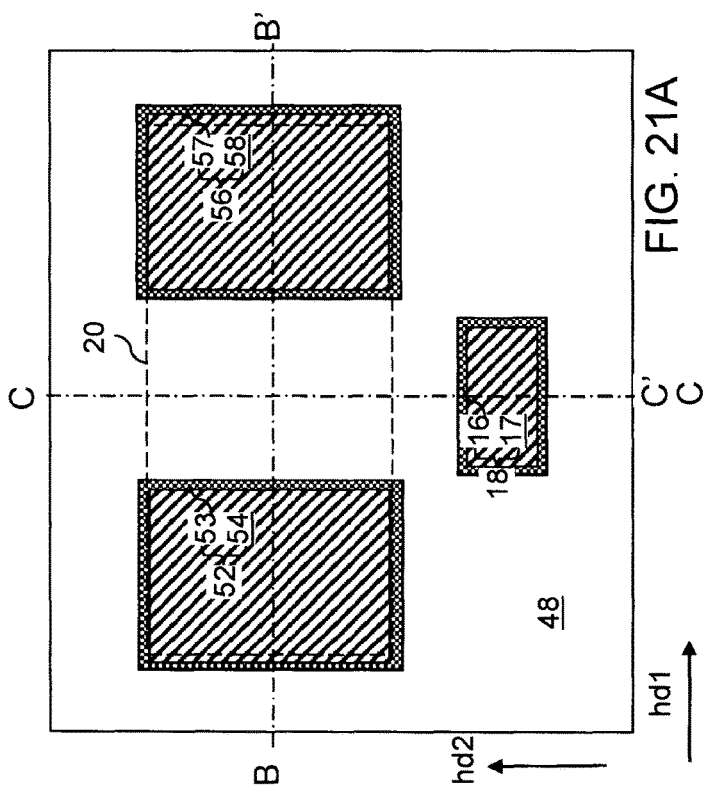
FIG. 21A is a top-down view of a region of a sixth exemplary structure according to a sixth embodiment of the present disclosure.
Figure 21B:
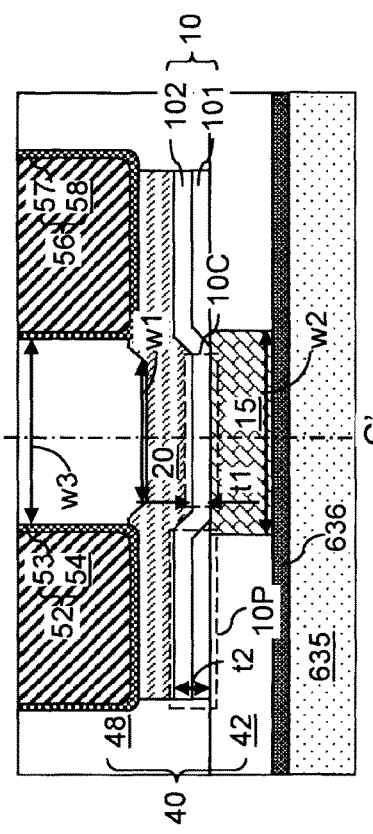
FIG. 21B is a vertical cross-sectional view of the sixth exemplary structure along the vertical plane B-B' of FIG. 21A.

Referring to FIGS. 21A-21C, a sixth exemplary structure according to a sixth embodiment of the present disclosure may be derived from any of the previously described exemplary structures by omitting formation of the passivation capping dielectric 30. The sixth exemplary structure provides the benefit of blocking diffusion of hydrogen, oxygen, and water vapor from the insulating layer 42 through the gate dielectric 10 into the active layer 20, although the benefit of blocking diffusion of hydrogen, oxygen, and water vapor by the passivation capping dielectric 30 is not provided by the sixth exemplary structure.

Figure 22C:
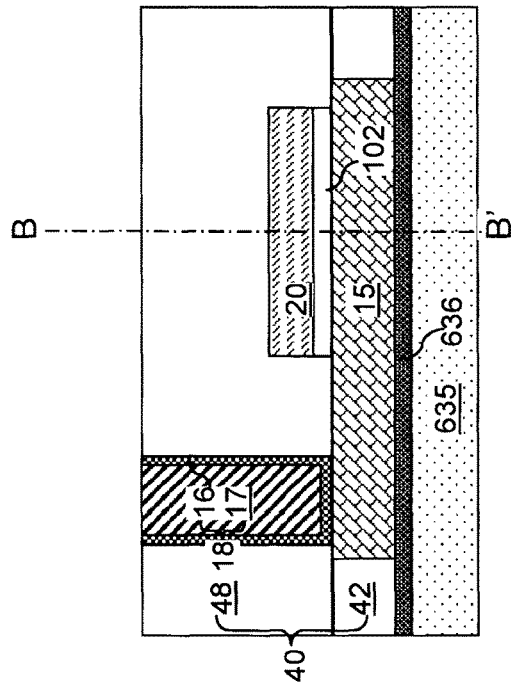
FIG. 22C is a vertical cross-sectional view of the seventh exemplary structure along the vertical plane C-C' of FIG. 22A.
Figure 22A:
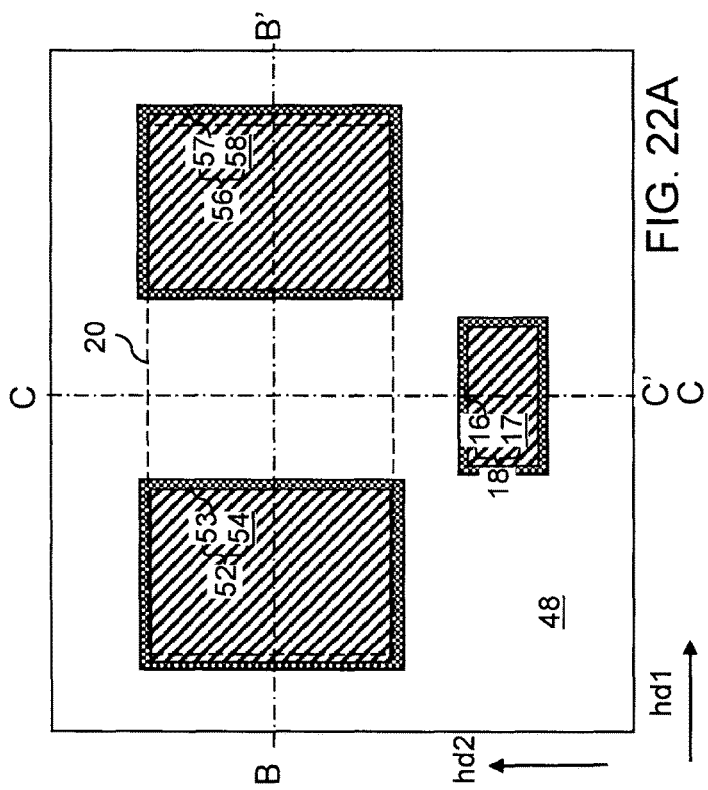
FIG. 22A is a top-down view of a region of a seventh exemplary structure according to a seventh embodiment of the present disclosure.
Figure 22B:
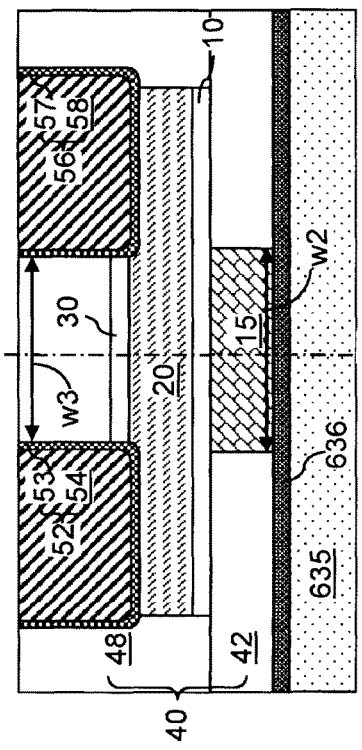
FIG. 22B is a vertical cross-sectional view of the seventh exemplary structure along the vertical plane B-B' of FIG. 22A.

Referring to FIGS. 22A-22C, a seventh exemplary structure according to a seventh embodiment of the present disclosure may be derived from any of the first, second, third, fourth, and fifth exemplary structures by omitting formation of thinned portion of the gate dielectric 10. In other words, the gate dielectric 10 may have a uniform thickness throughout. The seventh exemplary structure provides the benefit of blocking diffusion of hydrogen, oxygen, and water vapor from the dielectric layer 48 through the passivation capping dielectric 30 into the active layer 20, although the benefit of blocking diffusion of hydrogen, oxygen, and water vapor by a thicker portion of the gate dielectric 10 above an interface with the insulating layer 42 is not provided by the seventh exemplary structure.

Figure 23:
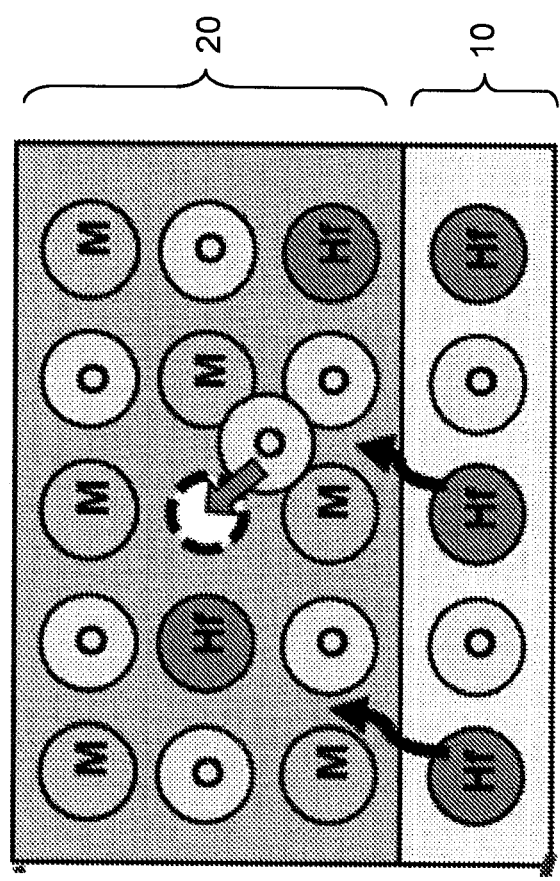
FIG. 23 is a schematic diagram illustrating a mechanism for a gate dielectric to enhance stability of a surface property of an active layer.

Referring to FIG. 23, a schematic diagram illustrates a mechanism for a gate dielectric 10 to enhance stability of a surface property of an active layer 20. In this embodiment, atoms of the metallic element within the dielectric metal oxide material of the gate dielectric 10 may diffuse into an interfacial region of the semiconducting metal oxide material of the active layer 20, and reduce the oxygen interstitials and oxygen vacancies, and the electrical stability of the semiconducting metal oxide material of the active layer 20 may be enhanced.

Figure 24:
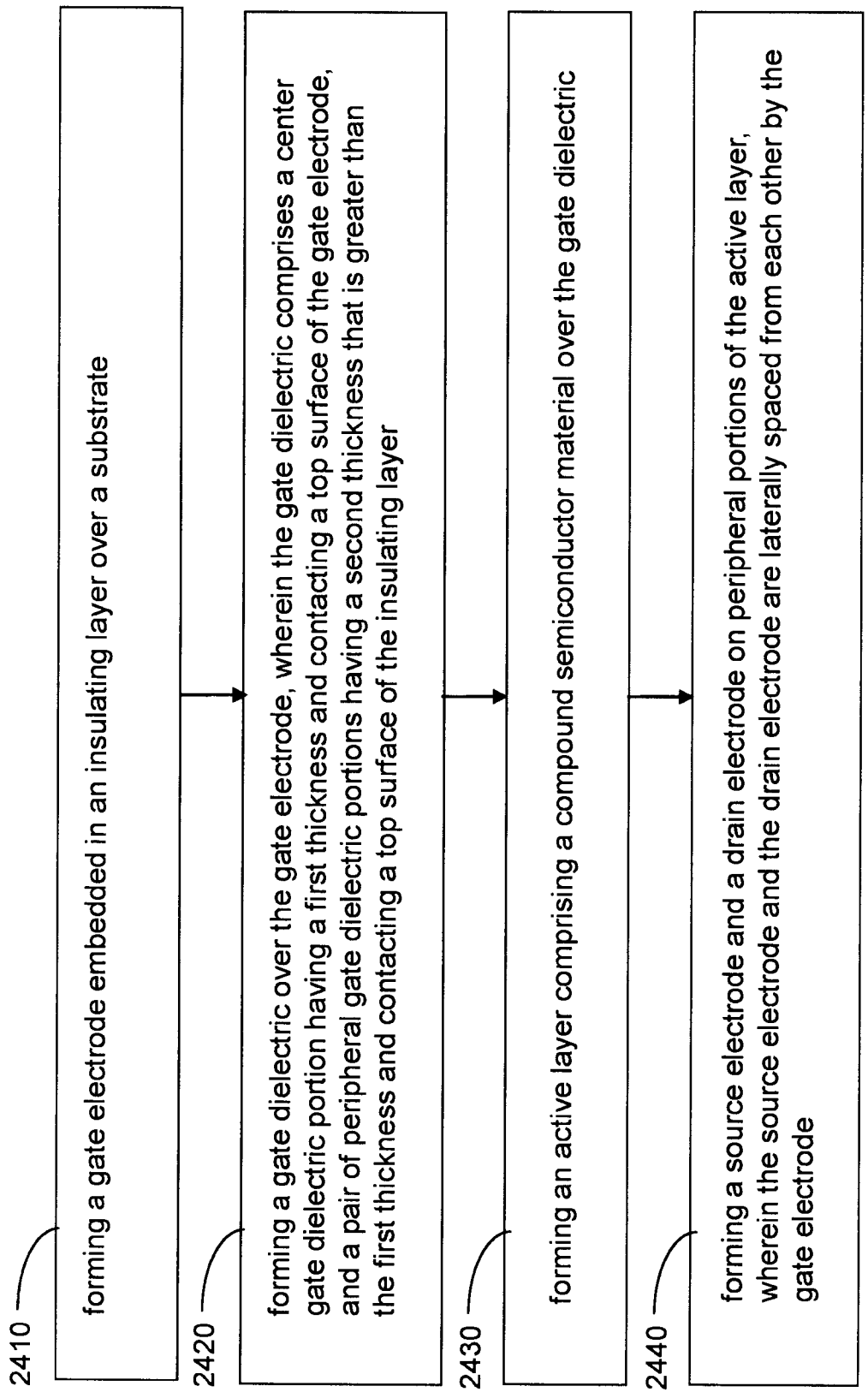
FIG. 24 is a flowchart that illustrates the general processing steps for manufacturing the semiconductor devices of the present disclosure.

Referring to FIG. 24, a flowchart illustrates the general processing steps for manufacturing the semiconductor devices of the present disclosure. Referring to step 2410 and FIGS. 1-4C, a gate electrode 15 embedded in an insulating layer 42 may be formed over a substrate 8.

Referring to step 2420 and FIGS. 5A-8C, 13A-15C, and 16A-21C, a gate dielectric 10 may be formed over the gate electrode 15. The gate dielectric 10 includes a center gate dielectric portion 10C having a first thickness t1 and contacting a top surface of the gate electrode 15, and a pair of peripheral gate dielectric portions 10P having a second thickness t2 that is greater than the first thickness t1 and contacting a top surface of the insulating layer 42.

Referring to step 2430 and FIGS. 7A-8C, 15A-15C, and 16A-21C, an active layer 20 comprising a compound semiconductor material may be formed over the gate dielectric 10.

Referring to step 2440 and FIGS. 9A-12C, 15A-15C, and 16A-21C, a source electrode 52 and a drain electrode 56 may be formed on peripheral portions of the active layer 20. The source electrode 52 and the drain electrode 56 are laterally spaced from each other by the gate electrode 15.

Referring to all drawings and according to various embodiments of the present disclosure, a transistor is provided, which includes: a gate electrode 15 embedded in an insulating layer 42 that overlies a substrate 8; a gate dielectric 10 that includes a center gate dielectric portion 10C having a first thickness t1 and contacting a top surface of the gate electrode 15, and a pair of peripheral gate dielectric portions 10P having a second thickness t2 that is greater than the first thickness t1, contacting a top surface of the insulating layer 42, and laterally spaced apart from each other by the center gate dielectric portion 10C; an active layer 20 that may include a compound semiconductor material and overlying the gate dielectric 10; a source electrode 52 contacting a first end portion of the active layer 20; and a drain electrode 56 contacting a second end portion of the active layer 20.

According to various embodiments of the present disclosure, a transistor is provided, which includes: a gate electrode 15 embedded in an insulating layer 42 that overlies a substrate 8; a gate dielectric 10 located over the gate electrode 15; an active layer 20 that may include a compound semiconductor material; a source electrode 52 contacting a first end portion of the active layer 20; a drain electrode 56 contacting a second end portion of the active layer 20; and a passivation capping dielectric 30 that may include a dielectric metal oxide material and overlying the active layer 20; and a dielectric layer 48 laterally surrounding the active layer 20, the source electrode 52, and the drain electrode 56, and contacting an entirety of a top surface of the passivation capping dielectric 30.

In some embodiments of the present disclosure, a gate dielectric 10 may have a pattern such that the gate dielectric 10 includes a thin region located between a gate electrode 15 and an active layer 20, and thick regions located between an underlying insulating layer 42 and portions of the active layer 20 that are laterally offset from an area of the gate electrode 15. In some embodiment, ions of the metallic element in the gate dielectric 10 (such as $Hf^{4+}$ ions in embodiments in which the gate dielectric 10 includes hafnium oxide) may diffuse into the semiconducting metal oxide material of the active layer 20 (such as an indium gallium zinc oxide material) and suppress oxygen deficiencies, and prevent hydrogen diffusion from the dielectric material of the insulating layer 42 (such as undoped silicate glass) into the semiconducting metal oxide material. Thus, a metal oxide material including atoms of the metallic element in the gate dielectric 10 and formed in a surface portion of the active layer 20 in proximity to the gate dielectric 10 may improve device stability of the thin film transistor by avoiding deleterious effects of hydrogen diffusion into the active layer 20.

In embodiments in which the passivation capping dielectric 30 is used, ions of the metallic element in the passivation capping dielectric 30 (such as $Hf^{4+}$ ions in embodiments in which the passivation capping dielectric 30 includes hafnium oxide) may diffuse into the semiconducting metal oxide material of the active layer 20 (such as an indium gallium zinc oxide material) and suppress oxygen deficiencies, and prevent hydrogen diffusion from the dielectric material of the dielectric layer 48 (such as undoped silicate glass) into the semiconducting metal oxide material. Thus, a metal oxide material including atoms of the metallic element in the passivation capping dielectric 30 and formed in a surface portion of the active layer 20 in proximity to the passivation capping dielectric 30 may improve device stability of the thin film transistor by avoiding deleterious effects of hydrogen diffusion into the active layer 20.

Generally, metal-oxide bonding (such as Hf-O bonding) between metal atoms from the gate dielectric 10 or the passivation capping dielectric 30 within surface regions of the active layer 20 may prevent formation of oxygen vacancies within the surface regions. Thus, suppression of oxygen vacancies suppresses diffusion of hydrogen, oxygen, or water molecules into the active layer 20, and may significantly reduce external influence about ambient gases (such as hydrogen, oxygen, and/or water molecules) on the back channel (i.e., the chancel in contact with the gate dielectric 10) of the active layer 20, and thus may improve the reliability of the thin film transistor.

The various methods of the present disclosure provide simple and low-cost methods for improving process and environment stability of thin film transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a gate electrode embedded in an insulating layer that overlies a substrate;
   a gate dielectric comprising a center gate dielectric portion having a first thickness and contacting a top surface of the gate electrode, and a pair of peripheral gate dielectric portions having a second thickness that is greater than the first thickness and adjoined to the center gate dielectric portion;
   an active layer overlying the gate dielectric;
   a source electrode contacting a first end portion of the active layer; and
   a drain electrode contacting a second end portion of the active layer.

2. The transistor of claim 1, wherein the gate dielectric comprises a pair of taper regions having a variable thickness and connecting the center gate dielectric portion to a respective one of the peripheral gate dielectric portions, wherein each of the pair of taper regions has a tapered top surface that contacts a tapered bottom surface of the active layer.

3. The transistor of claim 1, wherein bottom surfaces of the pair of peripheral gate dielectric portions and a bottom surface of the center gate dielectric portion are located within a same horizontal plane.

4. The transistor of claim 1, wherein the gate dielectric has a same dielectric metal oxide material composition throughout.

5. The transistor of claim 1, wherein the gate dielectric comprises:
   a pair of first gate dielectric portions located in the pair of peripheral gate dielectric portions, comprising a first dielectric metal oxide material, and laterally spaced apart by the center gate dielectric portion; and
   a second gate dielectric portion continuously extending across the pair of peripheral gate dielectric portions and the center gate dielectric portion and comprising a second dielectric metal oxide material having a different material composition than the first dielectric metal oxide material.

6. The transistor of claim 5, wherein the second gate dielectric portion contacts the top surface of the gate electrode, and contacts top surfaces of the pair of first gate dielectric portions.

7. The transistor of claim 1, further comprising:
   a passivation capping dielectric comprising a dielectric metal oxide material, contacting a top surface of the active layer, and laterally extending between, and contacting sidewalls of, the source electrode and the drain electrode; and
   a dielectric layer laterally surrounding the active layer, the source electrode, and the drain electrode, and contacting an entirety of a top surface of the passivation capping dielectric.

8. The transistor of claim 7, wherein:
   the gate dielectric comprises at least one additional dielectric metal oxide material;
   sidewalls of the gate dielectric are vertically coincident with sidewalls of the active layer; and
   the dielectric metal oxide material of the passivation capping dielectric has a same material composition as one of the at least one additional dielectric metal oxide material, or has a material composition that is different from any of the at least one additional dielectric metal oxide material.

9. The transistor of claim 1, wherein a top surface of the active layer is vertically recessed over the center gate dielectric portion relative to horizontal surfaces of the active layer that contact a sidewall of the source electrode or a sidewall of the drain electrode.

10. A transistor comprising:
    a gate electrode embedded in an insulating layer that overlies a substrate;
    a gate dielectric located over the gate electrode;
    an active layer overlying the gate dielectric;
    a passivation capping dielectric comprising a dielectric metal oxide material and overlying the active layer and having sidewalls that are vertically coincident with sidewalls of the active layer and sidewalls of the gate dielectric; and
    a dielectric layer laterally surrounding the active layer and contacting an entirety of a top surface of the passivation capping dielectric.

11. The transistor of claim 10, further comprising:
    a source electrode vertically extending through the dielectric layer and contacting a first sidewall of the passivation capping dielectric and contacting a first end portion of the active layer; and a drain electrode vertically extending through the dielectric layer and contacting a second sidewall of the passivation capping dielectric and contacting a second end portion of the active layer.

12. The transistor of claim 11, wherein the passivation capping dielectric contacts a top surface of the active layer, and laterally extends between, and contacts sidewalls of, the source electrode and the drain electrode.

13. The transistor of claim 11, wherein:
the dielectric layer comprises a dielectric material selected from undoped silicate glass, a doped silicate glass, organosilicate glass, silicon oxynitride, and silicon oxynitride; and
top surfaces of the source electrode and the drain electrode are located within a same horizontal plane as a top surface of the dielectric layer.

14. The transistor of claim 10, wherein the gate dielectric comprises:
a center gate dielectric portion having a first thickness and contacting a top surface of the gate electrode; and
a pair of peripheral gate dielectric portions having a second thickness that is greater than the first thickness, contacting a top surface of the insulating layer, and laterally spaced apart from each other by the center gate dielectric portion.

15. The transistor of claim 14, wherein a bottom surface of the passivation capping dielectric comprises:
a pair of tapered surface segments contacting tapered top surface segments of the active layer; and
a horizontal bottom surface segment adjoined to bottom edges of the pair of tapered surface segments and contacting a horizontal surface segment of the active layer.

16. A method of forming a transistor, comprising:
forming a gate electrode over a substrate;
forming a gate dielectric over the gate electrode, wherein the gate dielectric comprises a center gate dielectric portion having a first thickness and a pair of peripheral gate dielectric portions having a second thickness that is greater than the first thickness;
forming an active layer over the gate dielectric;
forming a source electrode and a drain electrode on peripheral portions of the active layer, wherein the source electrode and the drain electrode are laterally spaced from each other by the gate electrode;

forming a passivation capping dielectric comprising a dielectric metal oxide material and overlying the active layer; and forming a dielectric layer over the passivation capping dielectric, wherein the source electrode the drain electrode are formed through the passivation capping dielectric on a respective surface segment of the active layer.

17. The method of claim 16, wherein forming the gate dielectric comprises:
forming a gate dielectric layer on the top surface of the gate electrode and on the top surface of the insulating layer;
forming a patterned photoresist layer including an opening over the gate dielectric layer;
thinning an unmasked portion of the gate dielectric layer by providing an etchant that etches a material of the gate dielectric layer through the opening in the patterned photoresist layer.

18. The method of claim 17, wherein:
the gate dielectric layer comprises a pair of taper regions having a variable thickness and overlying peripheral portions of the gate electrode; and
the method comprises patterning the gate dielectric layer into the gate dielectric such that sidewalls of the gate dielectric are vertically coincident with sidewalls of the active layer.

19. The method of claim 16, wherein forming the gate dielectric comprises:
forming a first gate dielectric layer on the top surface of the gate electrode and on the top surface of the insulating layer;
patterning the first gate dielectric layer, wherein a center portion of the top surface of the gate electrode is physically exposed; and
forming a second gate dielectric layer over patterned portions of the first gate dielectric layer and on the top surface of the gate electrode.

20. The method of claim 16, wherein:
the dielectric layer comprises a dielectric material selected from undoped silicate glass, a doped silicate glass, organosilicate glass, silicon oxynitride, and silicon oxynitride; and
top surfaces of the source electrode and the drain electrode are formed within a same horizontal plane as a top surface of the dielectric layer.

* * * * *